United States Patent
Okada et al.

(10) Patent No.: US 9,513,418 B2
(45) Date of Patent: Dec. 6, 2016

(54) COLOR MATERIAL DISPERSION LIQUID, COLOR RESIN COMPOSITION FOR COLOR FILTERS, COLOR FILTER, LIQUID CRYSTAL DISPLAY DEVICE, AND ORGANIC LIGHT-EMITTING DISPLAY DEVICE

(71) Applicant: DAI NIPPON PRINTING CO., LTD., Tokyo-to (JP)

(72) Inventors: Masato Okada, Tokyo-to (JP); Daisuke Endo, Tokyo-to (JP); Michihiro Ogura, Tokyo-to (JP); Tomoki Murata, Tokyo-to (JP); Hiroaki Segawa, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 0 days.

(21) Appl. No.: 15/141,026

(22) Filed: Apr. 28, 2016

(65) Prior Publication Data
US 2016/0238757 A1 Aug. 18, 2016

Related U.S. Application Data

(63) Continuation-in-part of application No. 14/396,217, filed as application No. PCT/JP2013/061221 on Apr. 15, 2013, now Pat. No. 9,354,367.

(30) Foreign Application Priority Data

Apr. 23, 2012 (JP) .................. 2012-097717
Feb. 8, 2013 (JP) .................. 2013-023697

(51) Int. Cl.
*G02B 5/20* (2006.01)
*C04B 11/00* (2006.01)
(Continued)

(52) U.S. Cl.
CPC ............... *G02B 5/223* (2013.01); *C09B 11/28* (2013.01); *C09D 11/322* (2013.01); *G02B 1/04* (2013.01);
(Continued)

(58) Field of Classification Search
CPC ....... G03F 7/0007; G02B 5/223; G02B 1/04; G02F 1/133514; H01L 27/322; C09B 67/0069; C09B 11/10
USPC .................. 430/7; 349/106; 106/402, 439
See application file for complete search history.

(56) References Cited

U.S. PATENT DOCUMENTS 4,223,144 A 9/1980 Kast et al.
5,352,740 A 10/1994 Ishidoya et al.
(Continued)

FOREIGN PATENT DOCUMENTS

JP 50-050030 A 4/1979
JP 54-050030 A 4/1979
(Continued)

OTHER PUBLICATIONS

International Search Report mailed Jul. 9, 2013; PCT/JP2013/061221.
(Continued)

*Primary Examiner* — John A McPherson
(74) *Attorney, Agent, or Firm* — Ladas & Parry LLP

(57) ABSTRACT

An object of the present invention is to provide: a color material dispersion liquid which is able to form a coating film with high luminance, excellent heat resistance and excellent light resistance. Disclosed is a color material dispersion liquid comprising a color material represented by the following general formula (I), a specific dispersant, and a specific solvent, wherein molybdenum and tungsten are (Continued)

contained in a polyoxometalate anion in the color material, and a molar ratio between the molybdenum and the tungsten is 0.4:99.6 to 15:85:

General Formula (I)

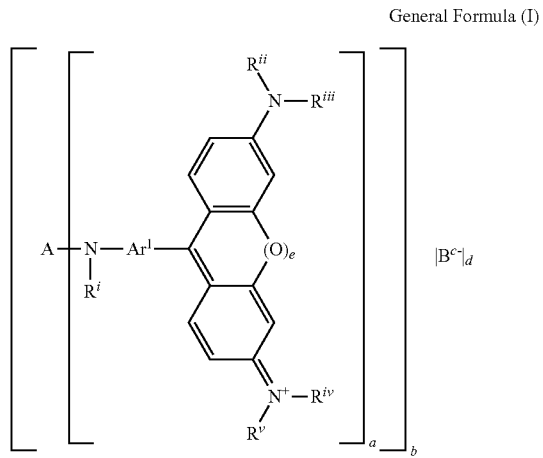

(Symbols shown in the general formula (I) are described in the Description.)

6 Claims, 3 Drawing Sheets

(51) Int. Cl.
| | | |
|---|---|---|
| G02B 5/22 | (2006.01) | |
| C09D 11/322 | (2014.01) | |
| G03F 7/00 | (2006.01) | |
| G03F 7/105 | (2006.01) | |
| C09B 11/28 | (2006.01) | |
| G02B 1/04 | (2006.01) | |
| G02F 1/1335 | (2006.01) | |
| H01L 27/32 | (2006.01) | |
| G03F 7/038 | (2006.01) | |

(52) U.S. Cl.
CPC ... *G02F 1/133514* (2013.01); *G02F 1/133516* (2013.01); *G03F 7/0007* (2013.01); *G03F 7/038* (2013.01); *G03F 7/105* (2013.01); *H01L 27/322* (2013.01)

(56) References Cited

U.S. PATENT DOCUMENTS

| | | | |
|---|---|---|---|
| 9,005,722 | B2 | 4/2015 | Okada |
| 2009/0233062 | A1 | 9/2009 | Nakamura et al. |
| 2010/0192312 | A1 | 8/2010 | Cremer et al. |
| 2011/0049444 | A1 | 3/2011 | Sako et al. |
| 2013/0016198 | A1 | 1/2013 | Higuchi et al. |
| 2014/0037866 | A1 | 2/2014 | Okada |
| 2014/0039201 | A1 | 2/2014 | Okada et al. |

FOREIGN PATENT DOCUMENTS

| | | |
|---|---|---|
| JP | 04-216561 A | 8/1992 |
| JP | 2006-106503 A | 4/2006 |
| JP | 2008-304766 A | 12/2008 |
| JP | 2010-526897 A | 8/2010 |
| JP | 2011-007847 A | 1/2011 |
| JP | 2011-186043 A | 9/2011 |
| JP | 2012-032754 A | 2/2012 |
| JP | 2013-076764 A | 4/2013 |
| WO | 2009/107734 A1 | 9/2009 |
| WO | 2011/037195 A1 | 3/2011 |
| WO | 2011/162217 A1 | 12/2011 |
| WO | 2012/039416 A1 | 3/2012 |
| WO | 2012/144520 A1 | 10/2012 |
| WO | 2012/144521 A1 | 10/2012 |

OTHER PUBLICATIONS

USPTO NFOA dated Mar. 12, 2015 in connection with U.S. Appl. No. 14/396,217.
USPTO FOA dated Sep. 1, 2015 in connection with U.S. Appl. No. 14/396,217.
USPTO NOA mailed Feb. 2, 2016 in connection with U.S. Appl. No. 14/396,217.
USPTO Supplemental NOA dated Apr. 14, 2016 in connection with U.S. Appl. No. 14/396,217.

COLOR MATERIAL DISPERSION LIQUID, COLOR RESIN COMPOSITION FOR COLOR FILTERS, COLOR FILTER, LIQUID CRYSTAL DISPLAY DEVICE, AND ORGANIC LIGHT-EMITTING DISPLAY DEVICE

TECHNICAL FIELD

The present invention relates to a color material dispersion liquid for color filters, a color resin composition for color filters, a color filter, a liquid crystal display device, and an organic light-emitting display device.

BACKGROUND ART

In recent years, along with the influence of a decrease in liquid crystal panel prices and the start of the digital terrestrial broadcasting service, flat panel displays have rapidly spread. Of flat panel displays that are currently in practical use, liquid crystal displays are widely used in not only TV or PC monitors, but also in mobile devices such as cellular phones, portable game devices and tablet PCs, and the liquid crystal panel market is expanding now.

Color filters function to colorize liquid displays. Under the above circumstance, there is an increasing demand for color filters with higher luminance, higher contrast and improved color reproducibility. Recently, due to reduction in power consumption of backlights and properties of LED backlights, there is especially a growing demand for color filters with higher luminance.

The above-mentioned issues apply to organic EL displays, which are expected to widely spread in the future, and higher luminance and improved color reproducibility are also the issues organic EL displays have to solve.

In general, a resin composition for forming a color filter is used to form color layers of color filters, the composition containing a pigment or dye as the color material. Compared to dies, pigments have better resistance properties, such as high heat resistance. However, sometimes color filters produced with pigments have insufficient luminance.

On the other hand, when dyes are used as the color material, color filters with high luminance can be obtained. However, the color filters have a problem with the resistance properties, such as heat resistance and light resistance.

As a method of increasing the resistance properties of dyes, a method of forming a salt-forming compound has been known (for example, see Patent Literatures 1 to 4).

An example is disclosed in Patent Literature 1, in which a chloride ion or an aryl sulfate ion is used as a counter anion of a triarylmethane dye to improve heat durability of the triarylmethane dye.

In Patent Literature 2, as a method of obtaining a coloring resin composition which has not only excellent light resistance but also excellent heat resistance, a salt forming method has been reported, in which a salt is formed by using a sulfonated compound of a dye skeleton such as phthalocyanine or anthraquinone, which is the counter anion, in combination with a triarylmethane skeleton, which is the cation.

However, the salt-forming compounds described in Patent Literatures 1 and 2 are those which are basically dissolved in solvents for use. They have insufficient heat resistance and light resistance.

In Patent Literature 3, as a method of obtaining a color composition for color filters with excellent color characteristics, heat resistance, light resistance and solvent resistance, a salt-forming compound comprising a triarylmethane basic dye and a sulfonated organic compound having at least two sulfonic groups, is disclosed.

In Patent Literature 4, as a blue pigment for color filters that is able to realize liquid crystal display with excellent luminance for a long period of time and at high temperature, a basic triarylmethane dye in which one or more elements selected from tungsten, silicon and phosphorus, and oxygen are contained as essential elements in the anions, is disclosed.

However, as will be shown below with comparative examples, the technique of Patent Literature 3 provides poor light resistance, while the technique of Patent Literature 4 provides poor heat resistance.

A polysiloxane dye is disclosed in Patent Literature 5, which is highly cross-linked by polysiloxane containing at least ten Si atoms. Due to its synthesis method, the polysiloxane dye disclosed in Patent Literature 5 is a mixture in which an unreacted compound having only one dye skeleton or dyes with different polymerization degrees are present. It is difficult to separate only a dye with a specific polymerization degree from the polysiloxane dye, so that there is a problem with the productivity of the polysiloxane dye. Since the polysiloxane dye contains a silanol group or alkoxysilyl group, a siloxane bond is formed between the polysiloxane dye(s) or between the polysiloxane dye and other component having a silanol group or alkoxysilyl group. As a result, there is a deterioration in the state of a solution or dispersion liquid containing the polysiloxane dye, such as a change in solubility or an influence on dispersion stability, making it difficult to handle the solution or dispersion liquid. This reaction is likely to proceed especially by heating, so that the dye of Patent Literature 5 is not suitable for color filter applications. As will be shown below with comparative examples, the color filter containing the polysiloxane dye has poor heat resistance.

CITATION LIST

Patent Literature 1: Japanese Patent Application Laid-Open (JP-A) No. 2008-304766
Patent Literature 2: International Publication No. WO 2009/107734
Patent Literature 3 JP-A No. 2011-7847
Patent Literature 4: JP-A No. 2011-186043
Patent Literature 5: Japanese Patent Application National Publication (Laid-Open) No. 2010-526897

SUMMARY OF INVENTION

Technical Problem

The present invention was achieved in light of the above circumstances. An object of the present invention is to provide: a color material dispersion liquid which is able to form a coating film with high luminance, excellent heat resistance and excellent light resistance; a color resin composition for color filters, which is able to form a color layer with high luminance, excellent heat resistance and excellent light resistance; a color filter formed with the color resin composition for color filters; a liquid crystal display device having the color filter; and an organic light-emitting display device having the color filter.

Solution to Problem

As the result of diligent researches made to attain the above object, the inventors of the present invention have found that it is possible to obtain a color material dispersion liquid which is able to form a coating film that has excellent heat resistance and excellent light resistance, with achieving higher luminance as that of dyes, by dispersing a color material comprising a specific cation and a specific polyoxometalate anion in a solvent in which the color material is substantially insoluble or hardly soluble and using the dispersion.

In addition, the inventors have found that both excellent heat resistance and excellent light resistance are obtained when the molar ratio between molybdenum and tungsten contained in the polyoxometalate anion is within a specific range. Furthermore, the inventors have found that when the molar ratio between molybdenum and tungsten in the polyoxometalate anion is within a different specific range, a deterioration in the luminance of the color layer heated at high temperature is reduced.

The present invention was completed based on these findings.

The color material dispersion liquid of the present invention is a color material dispersion liquid for color filters, containing a color material represented by the following general formula (I), a dispersant, and a solvent having a solubility of the color material of 0.1 (mg/10 g solvent) or less at 23° C., wherein the dispersant is a polymer dispersant in which a nitrogen atom is contained in a main or side chain thereof, and wherein molybdenum and tungsten are contained in a polyoxometalate anion in the color material, and a molar ratio between the molybdenum and the tungsten is 0.05/99.95 or more and less than 0.4/99.6:

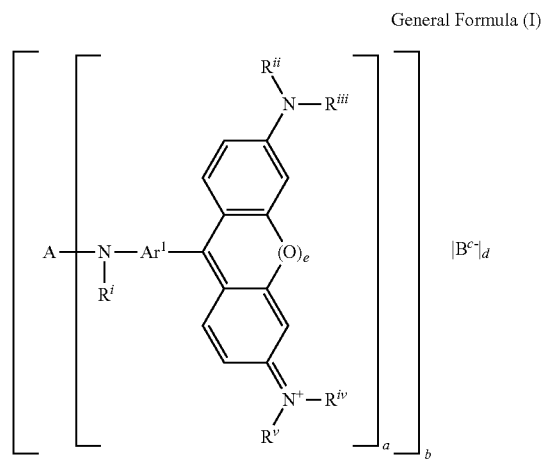

General Formula (I)

wherein A is an "a"-valent organic group in which a carbon atom directly bound to N has no π bond, and the organic group is a n aliphatic hydrocarbon group having a saturated aliphatic hydrocarbon group at least at a terminal position directly bound to N, or an aromatic group having the aliphatic hydrocarbon group having a saturated aliphatic hydrocarbon group at least at a terminal position directly bound to N, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which ca n have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; $R^i$s can be the same or different; $R^{ii}$s can be the same or different; $R^{iii}$s can be the same or different; $R^{iv}$s can be the same or different; $R^v$s can be the same or different; and $Ar^1$s can be the same or different; and wherein each of "a" and "c" is an integer of 2 or more; each of "b" and "d" is an integer of 1 or more; "e" is 0 or 1 and there is no bond when "e" is 0; and "e"s can be the same or different.

In the color material dispersion liquid of the present invention, from the viewpoint of being excellent in dispersion stability, the solvent is preferably an ester solvent.

In the color material dispersion liquid of the present invention, from the viewpoint of increasing the dispersibility and dispersion stability of the color material and being excellent in heat resistance and light resistance, the dispersant is preferably a polymer dispersant in which a nitrogen atom is contained in a main or side chain thereof.

The color resin composition for color filters according to the present invention contains the color material dispersion liquid of the present invention and a binder component. By containing the color material dispersion liquid of the present invention, the color resin composition for color filters according to the present invention is able to form a high-luminance color layer with excellent heat resistance and light resistance.

The present invention provides a color filter containing at least a transparent substrate and color layers disposed on the substrate, wherein at least one of the color layers is a color layer which is a cured product of the above-described color resin composition for color filters.

The present invention also provides a liquid crystal display device containing the above-described color filter, a counter substrate, and a liquid crystal layer present between the color filter and the counter substrate.

The present invention also provides an organic light-emitting display device containing the above-described color filter and an organic light-emitting material.

Advantageous Effects of Invention

According to the present invention, it is possible to provide: a color material dispersion liquid which is able to form a coating film with high luminance, excellent heat resistance and excellent light resistance; a color resin composition for color filters, which is able to form a color layer with high luminance, excellent heat resistance and excellent light resistance; a color filter formed with the color resin composition for color filters; a liquid crystal display device having the color filter; and an organic light-emitting display device having the color filter.

DESCRIPTION OF EMBODIMENTS

Figure 1:
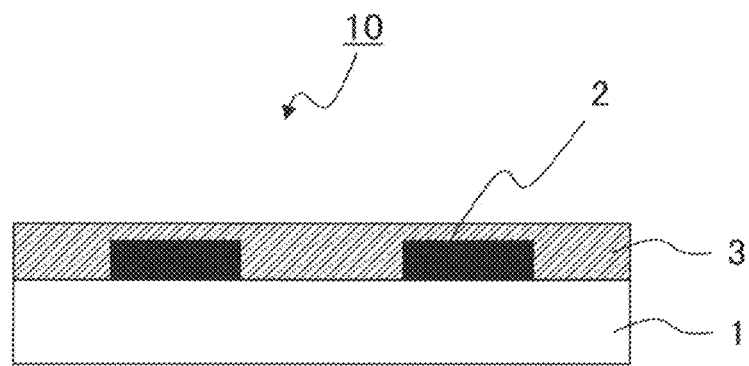
FIG. 1 is a schematic view showing an example of the color filter of the present invention.

Hereinafter, the color material dispersion liquid, color resin composition for color filters, color filter, liquid crystal display device and organic light-emitting display device of the present invention, will be described in order.

In the present invention, "light" encompasses electromagnetic waves in visible and non-visible wavelength ranges and radial rays. Radial rays include microwaves and electron beams, more specifically, electromagnetic waves having a wavelength of 5 μm or less and electron beams. Also in the present invention, "(meth)acryl" means any one of acryl and methacryl, and "(meth)acrylate" means any one of acrylate and methacrylate.

[Color Material Dispersion Liquid]

The color material dispersion liquid of the first embodiment of the present invention is a color material dispersion liquid containing a color material represented by the following general formula (I), a dispersant, and a solvent having a solubility of the color material of 0.1 (mg/10 g solvent) or less at 23° C., wherein molybdenum and tungsten are contained in a polyoxometalate anion in the color material, and a molar ratio between the molybdenum and the tungsten is 0.4:99.6 to 15:85:

General Formula (I)

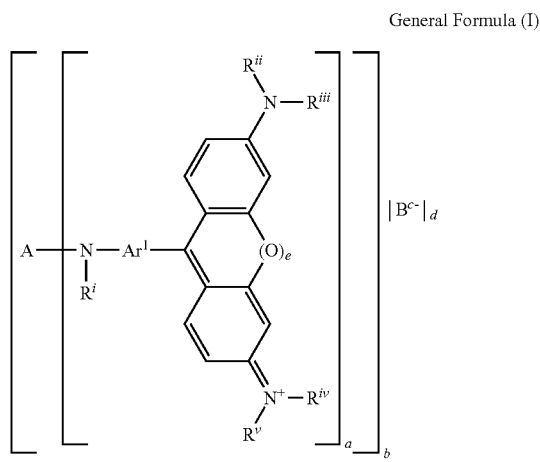

wherein A is an "a"-valent organic group in which a carbon atom directly bound to N has no π bond, and the organic group is an aliphatic hydrocarbon group having a saturated aliphatic hydrocarbon group at least at a terminal position directly bound to N, or an aromatic group having the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; $R^i$s can be the same or different; $R^{ii}$s can be the same or different; $R^{iii}$s can be the same or different; $R^{iv}$s can be the same or different; $R^v$s can be the same or different; and $Ar^1$s can be the same or different; and wherein each of "a" and "c" is an integer of 2 or more; each of "b" and "d" is an integer of 1 or more; "e" is 0 or 1 and there is no bond when "e" is 0; and "e"s can be the same or different.

The color material dispersion liquid of the second embodiment of the present invention is a color material dispersion liquid containing a color material represented by the general formula (I), a dispersant, and a solvent having a solubility of the color material of 0.1 (mg/10 g solvent) or less at 23° C., wherein at least tungsten is contained in a polyoxometalate anion in the color material, and a molar ratio of molybdenum to the tungsten is less than 0.4/99.6.

The first embodiment of the color material dispersion liquid of the present invention and the second embodiment of the color material dispersion liquid of the present invention, are each a color material dispersion liquid which is able to form a coating film that has excellent heat resistance and excellent light resistance, with achieving higher luminance as that of dyes. The color material dispersion liquid is obtained by dispersing a combination of the color material represented by the general formula (I) and a dispersant in a solvent in which the color material is substantially insoluble or hardly soluble and using the dispersion.

The color material dispersion liquid of the first embodiment and that of the second embodiment are both excellent in heat resistance and light resistance. In the color material dispersion liquid of the first embodiment, molybdenum and tungsten are contained in the polyoxometalate anion in the color material, and the molar ratio between the molybdenum and the tungsten is 0.4:99.6 to 15:85. Therefore, the color material dispersion liquid of the first embodiment is particularly excellent in light resistance. In the color material dispersion liquid of the second embodiment, at least tungsten is contained in the polyoxometalate anion in the color material, and the molar ratio of molybdenum to the tungsten is less than 0.4/99.6. Therefore, a deterioration in the luminance of the color layer heated at high temperature is reduced.

The mechanism of production of these effects by the above-specified combination is not understood yet; however, it is estimated as follows.

Figure 5:
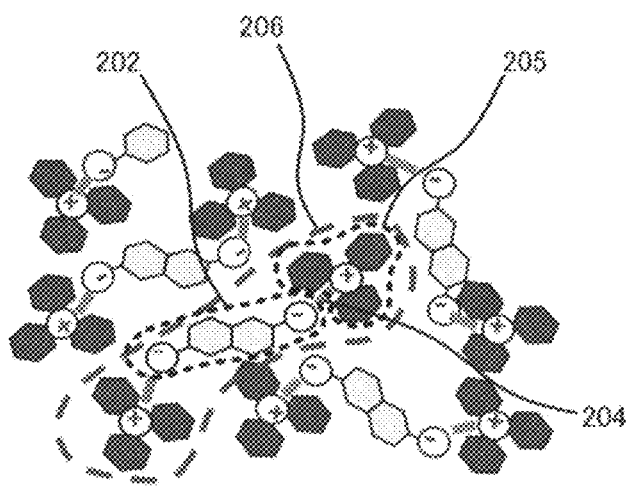
FIG. 5 is a schematic view showing ionic bonds of a conventional dye salt-forming compound.

In general, dyes are freely soluble in solvents. To decrease the solubility, a method of making dyes into a salt-forming compound has been used. For example, as a method of forming a salt with a triarylmethane dye, there is a method of using a divalent anion as a counter anion (for example, Patent Literature 3). According to this method, as shown in FIG. 5, a divalent counter anion 202 can form ionic bonds 204 with two dye cations 205, so that heat resistance and light resistance are improved compared to the case of using only a dye. However, even by this method, sufficient heat resistance and light resistance are not obtained.

Figure 4:
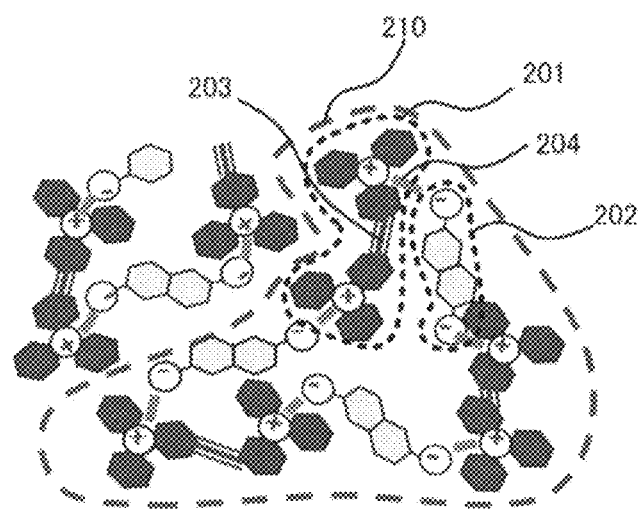
FIG. 4 is a schematic view showing a molecular association state of the color material of the present invention.

As shown in FIG. 4, as well as divalent or higher counter anions 202, the color material represented by the general formula (I) of the present invention has divalent or higher counter cations 201, in which two or more cationic color-forming moieties are bound through linkage 203 by A. For example, in the case where both anions and cations are divalent ions, it is assumed that in the aggregate of the color material, each of the anions and each of the cations do not merely form an ionic bond on a one molecule-to-one molecule (one-to-one) basis, but a molecular association 210 is formed, in which plural molecules are continuously connected through ionic bonds and associated, as shown in FIG. 4. The molecular association 210 behaves like one molecule in the aggregate of the color material, so that the apparent molecular weight of the molecular association is significantly more than the molecular weight of the conventional salt-forming compound. In addition, the formation of the molecular association 210 makes the cohesion in a solid state higher, thus decreasing the motion by heat and increasing the electric stability. Therefore, it is assumed that the dissociation of the ion pairs and the decomposition of the cationic moieties can be inhibited. As a result, it is estimated that the heat resistance and light resistance of the color material represented by the general formula (I) are increased.

A cationic color material is generally known to be oxidized and discolored by light. It is also known that a polyoxometalate containing tungsten or molybdenum has photoreduction properties, and the photoreduction reaction is reversible. It is assumed that by using such a polyoxometalate as an anion, a light-induced cation oxidation reaction is inhibited, and the light resistance of the color material is increased. The mechanism is not clear yet; however, it is assumed that by containing a tungsten-containing polyoxometalate anion and a molybdenum-containing polyoxometalate anion at a specific ratio, both of which anions are in different electronic states, the color material is provided with excellent ability to inhibit the oxidation reaction.

In the first color material used in the color material dispersion liquid of the first embodiment, a divalent or higher polyoxometalate anion in which molybdenum and tungsten are contained and the molar ratio between the molybdenum and the tungsten is 0.4:99.6 to 15:85, are used as a counter anion. By mixing the molybdenum-containing polyoxometalate anion in a small amount, the light resistance and heat resistance of the color material are further increased, compared to the case of using only the tungsten-containing polyoxometalate anion. It is assumed that when ion pairs are formed between cations and the tungsten-containing polyoxometalate anions, the heat resistance of the color material is especially increased. However, it is assumed that the tungsten-containing polyoxometalate ion has a large ion size, so that and spaces are formed between the ions and the cations. On the other hand, it is assumed that the molybdenum-containing polyoxometalate anion has a smaller ion size than the tungsten-containing polyoxometalate anion. It is assumed that because the color material used in the present invention contains a small amount of the molybdenum-containing polyoxometalate anion with a smaller ion size, the molybdenum-containing polyoxometalate anion enters into the spaces formed when the ion pairs were formed between the cations and the tungsten-containing polyoxometalate anions. Therefore, it is assumed that the heat resistance and light resistance of the color material are increased. In the case of using a heteropolyoxometalate containing both molybdenum and tungsten, it is assumed that the heteropolyoxometalates have an ion size distribution by themselves and the heteropolyoxometalates with a small ion size enter into the spaces formed between the cations and the heteropolyoxometalates, so that the heat resistance and light resistance of the color material are increased.

Meanwhile, as the second color material used in the color material dispersion liquid of the second embodiment contains, a divalent or higher polyoxometalate anion in which at least tungsten is contained and the molar ratio of molybdenum to the tungsten is 0.05/99.95 or more and less than 0.4/99.6, is used as a counter anion. As mentioned above, when ion pairs are formed between the cations and the tungsten-containing polyoxometalate anions, especially the heat resistance of the color material is increased, and the color material dispersion liquid of the second embodiment has a heat resistance that is similar to that of the color material dispersion liquid of the first embodiment. In the area of color filter applications, a color filter with an especially high luminance is required. From this viewpoint, the inventors of the present invention provided further insights into heat resistance. As a result, they have found that when the molar ratio of molybdenum to the tungsten is less than 0.4/99.6, i.e., the molybdenum content in the polyoxometalate anions is low, or when molybdenum is not contained in the polyoxometalate anions and only tungsten is contained therein, the luminance of the color layer subjected to exposure is higher compared to the case of using the color material dispersion liquid of the first embodiment; moreover, a deterioration in the luminance of the color layer heated at high temperature is further reduced, compared to the case of using the color material dispersion liquid of the first embodiment. The mechanism of production of these effects is not understood yet; however, the color layer formed by using the color material dispersion liquid containing the second color material as mentioned above, can achieve higher luminance.

From these results, it is assumed that the color material represented by the general formula (I) has particularly excellent heat resistance and light resistance, and it is possible to obtain a color material dispersion liquid which is able to form a coating film that has excellent heat resistance and light resistance, with achieving higher luminance as that of dyes.

The color material dispersion liquid of the present invention contains at least a color material, a dispersant and a solvent, and it can contain other components, as needed.

Hereinafter, the components of the color material dispersion liquid of the present invention will be described in order and in detail.

In the present invention, the color material used in the color material dispersion liquid of the first embodiment may be referred to as "first color material", and the color material used in the color material dispersion liquid of the second embodiment may be referred to as "second color material". Also in the present invention, the color material dispersion liquid of the first embodiment and that of the second embodiment may be generically referred to as simply "color material dispersion liquid". The first color material and the second color material may be generically and simply referred to as "color material".

(Color Material)

The first color material used in the color material dispersion liquid of the first embodiment is represented by the following general formula (I); molybdenum and tungsten are contained in the polyoxometalate anion; and the molar ratio between the molybdenum and the tungsten is 0.4:99.6 to 15:85:

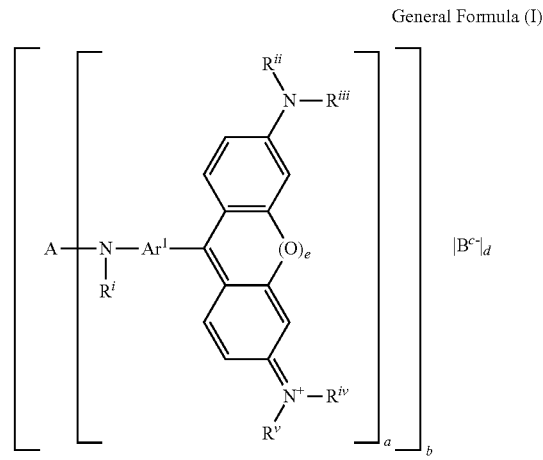

General Formula (I)

wherein A is an "a"-valent organic group in which a carbon atom directly bound to N has no $\pi$ bond, and the organic group is an aliphatic hydrocarbon group having a saturated aliphatic hydrocarbon group at least at a terminal position directly bound to N, or an aromatic group having the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; $R^i$s can be the same or different; $R^{ii}$s can be the same or different; $R^{iii}$s can be the same or different; $R^{iv}$s can be the same or different; $R^v$s can be the same or different; and $Ar^1$s can be the same or different; and wherein each of "a" and "c" is an integer of 2 or more; each of "b" and "d" is an integer of 1 or more; "e" is 0 or 1 and there is no bond when "e" is 0; and "e"s can be the same or different.

The second color material used in the color material dispersion liquid of the second embodiment is represented by the general formula (I) and at least tungsten is contained in the polyoxometalate anion, and the molar ratio of molybdenum to the tungsten is less than 0.4/99.6.

Both the first color material and the second color material have excellent heat resistance and excellent light resistance. The first color material is particularly characterized by having excellent light resistance, and the second color material is particularly characterized by reducing a deterioration in the luminance of the color layer heated at high temperature.

The cationic moiety of the color material used in the present invention is a divalent or higher cation having a structure represented by the following general formula (II). Unlike the conventional triarylmethane basic dyes and xanthene basic dyes, even a chloride of the cationic moiety represented by the following general formula (II) does not substantially dissolve in water.

The structure represented by the following general formula (II) refers to a divalent or higher cation, in which cations each containing a conventional triarylmethane or xanthene skeleton are bound through A.

If it is considered that the binding species connecting a monocation consisting of only one conventional triarylmethane or xanthene skeleton and an anion is an ionic bond only, it can be considered that the binding species of the salt-forming component consisting of the divalent or higher cation of the present invention includes covalent bonds which connect monocations in addition to ionic bonds. Therefore, it is assumed that since the salt-forming component containing the divalent or higher cation having the structure represented by the following general formula (II) contains an increased amount of stronger binding species throughout the constituent elements compared to the conventional salt-forming component containing one triarylmethane or xanthene skeleton only, there is an increase in the stability of the salt-forming component and the component hardly cause hydration. Furthermore, it is assumed that since the molecular weight and hydrophobicity of the structure represented by the following general formula (II) are increased due to the linking group A, the divalent or higher cation becomes substantially insoluble in water, in cooperation with an increase in the stability of bonds.

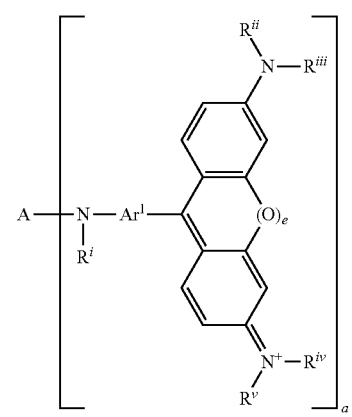

General Formula (II)

In this formula, A, $R^i$ to $R^v$, $Ar^1$, "a" and "e" are the same as those in the general formula (I).

In the general formula (I), "e" is an integer of 0 or 1. When is 0, the present invention has a triarylmethane skeleton represented by the following general formula (III):

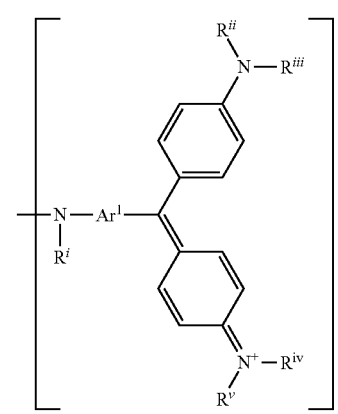

General Formula (III)

wherein $R^i$ to $R^v$ and $Ar^1$ are the same as those in the general formula (I).

When "e" is 1, the present invention has a xanthene skeleton represented by the following general formula (IV):

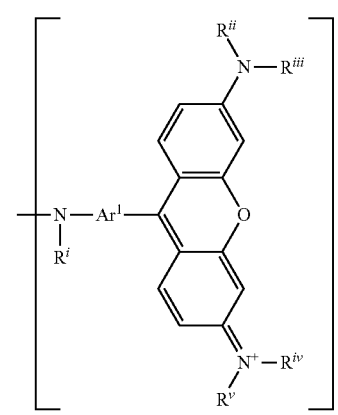

General Formula (IV)

wherein $R^i$ to $R^v$ and $Ar^1$ are the same as those in the general formula (I).

In the general formula (I), multiple "e"'s can be the same or different. The examples include a cationic moiety having a plurality of triarylmethane or xanthene skeletons only, and a cationic moiety having both triarylmethane and xanthene skeletons per molecule. From the viewpoint of color purity, the cationic moiety having the same skeletons only is preferable. On the other hand, by having the cationic moiety including both triarylmethane and xanthene skeletons, or depending on the combination of substituent groups that will be described hereinafter, it is possible to adjust the color of the color material represented by the general formula (I) to a desired color.

In the general formula (I), A is an "a"-valent organic group in which a carbon atom directly bound to N (nitrogen atom) has no n bond. The organic group is an aliphatic hydrocarbon group having a saturated aliphatic hydrocarbon group at least at a terminal position directly bound to N, or an aromatic group having the aliphatic hydrocarbon group, and O (oxygen atom), S (sulfur atom), N (nitrogen atom) can be contained in a carbon chain of the organic group. Since the carbon atom directly bound to N has no n bond, the color characteristics of the cationic color-forming moiety, such as color tone and transmittance, are not affected by the linking group A and other color-forming moieties, thereby allowing the same color as that of a single color-forming moiety. From the viewpoint of heat resistance and light resistance, it is preferable that A does not have a siloxane bond, and it is also preferable that A does not have a silicon atom (Si).

In A, as long as the carbon atom being at the terminal position and directly bound to N has no n bond, the aliphatic hydrocarbon group having a saturated aliphatic hydrocarbon group at least at a terminal position directly bound to N, can be in a straight-chain, branched-chain or cyclic form, have an unsaturated bond in carbon atoms except the one in the terminal position, have a substituent group, or contain O, S, N in the carbon chain. For example, a carbonyl group, a carboxyl group, an oxycarbonyl group and/or an amide group can be contained, a hydrogen atom can be substituted by a halogen atom, etc.

Also in A, as the aromatic group having an aliphatic hydrocarbon group, there may be exemplified a monocyclic or polycyclic aromatic group which has an aliphatic hydrocarbon group having a saturated aliphatic hydrocarbon group at least at the terminal position directly bound to N. The aromatic group can have a substituent group, and it can be a heterocyclic ring containing O, S or N.

Particularly, from the viewpoint of skeleton toughness, it is preferable that A contains a cyclic aliphatic hydrocarbon group or an aromatic group.

As the cyclic aliphatic hydrocarbon group, a bridged alicyclic hydrocarbon group is particularly preferable from the viewpoint of skeleton toughness. The bridged alicyclic hydrocarbon group refers to a polycyclic aliphatic hydrocarbon group having a bridged structure in the aliphatic ring and having a polycyclic structure. The examples include norbornane, bicyclo[2,2,2]octane and adamantane. Of bridged alicyclic hydrocarbon groups, norbornane is preferable. Examples of the aromatic group include groups containing a benzene ring and those containing a naphthalene ring. Of them, groups containing a benzene ring are preferable.

From the viewpoint of availability of raw materials, A is preferably divalent. When A is a divalent organic group, examples of the divalent organic group include a straight-chain, branched-chain or cyclic alkylene group having 1 to 20 carbon atoms, and an aromatic group in which two alkylene groups each having 1 to 20 carbon atoms are bound by substitution, such as a xylylene group.

The alkyl group at each of $R^i$ to $R^v$ is not particularly limited. Examples of the alkyl group include a straight- or branched-chain alkyl group having 1 to 20 carbon atoms. Of them, preferred is a straight- or branched-chain alkyl group having 1 to 8 carbon atoms, more preferred is a straight- or branched-chain alkyl group having 1 to 5 carbon atoms, from the viewpoint of ease of production and availability of raw materials. Of them, still more preferred is an ethyl group or a methyl group. A substituent group that the alkyl group can have is not particularly limited. The examples include an aryl group, a halogen atom and a hydroxyl group. As the substituted alkyl group, a benzyl group can be exemplified.

The aryl group at each of $R^i$ to $R^v$ is not particularly limited. The examples include a phenyl group and a naphthyl group. As a substituent group that the aryl group can have, an alkyl group and a halogen atom can be exemplified.

"$R^{ii}$ and $R^{iii}$ can be bound to form a ring structure, and/or $R^{iv}$ and $R^v$ can be bound to form a ring structure" means that $R^{ii}$ and $R^{iii}$ form a ring structure through a nitrogen atom and/or $R^{iv}$ and $R^v$ form a ring structure through a nitrogen atom. The ring structure is not particularly limited, and the examples include a pyrrolidine ring, a piperidine ring and a morpholine ring.

Particularly, from the viewpoint of chemical stability, it is preferable that each of $R^i$ to $R^v$ is independently a hydrogen atom, an alkyl group having 1 to 5 carbon atoms, or a phenyl group. Or, it is preferable that $R^{ii}$ and $R^{iii}$ are bound to form a pyrrolidine ring, a piperidine ring or a morpholine ring, and/or $R^{iv}$ and $R^v$ are bound to form a pyrrolidine ring, a piperidine ring or a morpholine ring.

Each of $R^i$ to $R^v$ can independently have the above structure. Particularly, from the viewpoint of color purity, it is preferable that $R^i$ is a hydrogen atom. From the viewpoint of ease of production and availability of raw materials, it is more preferable that all of $R^{ii}$ to $R^v$ are the same.

The divalent aromatic group in $Ar^1$ is not particularly limited. The aromatic group can be a heterocyclic group or an aromatic hydrocarbon group composed of a carbon ring. Examples of the aromatic hydrocarbon in the aromatic hydrocarbon group include: a benzene ring; condensed polycyclic aromatic hydrocarbons such as a naphthalene ring, a tetralin ring, an indene ring, a fluorene ring, an anthracene ring and a phenanthrene ring; and chain polycyclic hydrocarbons such as biphenyl, terphenyl, diphenylmethane, triphenylmethane and stilbene. The chain polycyclic hydrocarbon can have O, S, N in the chain skeleton, such as diphenyl ether. On the other hand, examples of the heterocyclic ring in the heterocyclic group include: five-membered heterocyclic rings such as furan, thiophene, pyrrol, oxazole, thiazole, imidazole and pyrazole; six-membered heterocyclic rings such as pyran, pyrone, pyridine, pyrone, pyridazine, pyrimidine and pyrazine; and condensed polycyclic heterocyclic rings such as benzofuran, thionaphthene, indole, carbazole, coumalin, benzo-pyrone, quinoline, isoquinoline, acridine, phthalazine, quinazoline and quinoxaline. These aromatic groups can have a substituent group.

As the substituent group that the aromatic group can have, an alkyl group having 1 to 5 carbon atoms and a halogen atom can be exemplified.

$Ar^1$ is preferably an aromatic group having 6 to 20 carbon atoms, more preferably an aromatic group having a condensed polycyclic carbon ring having 10 to 14 carbon atoms. Still more preferred are a phenylene group and a naphthylene group, from the point of view that the structure is simple and the raw materials are low-cost.

$R^i$s per molecule can be the same or different; $R^{ii}$s per molecule can be the same or different; $R^{iii}$s per molecule can be the same or different; $R^{iv}$s per molecule can be the same or different; $R^v$s per molecule can be the same or different; and $Ar^1$s per molecule can be the same or different. The color-forming moieties can exhibit the same color when, in all of the moieties, $R^i$s are the same; $R^{ii}$s are the same; $R^{iii}$s are the same; $R^{iv}$s are the same; $R^v$s are the same; and $Ar^1$s are the same. In this case, therefore, the color material can reproduce the same color as that of a single color-forming moiety, which is preferable from the viewpoint of color purity. On the other hand, if at least one selected from the group consisting of $R^i$s, $R^{ii}$s, $R^{iii}$s, $R^{iv}$s, $R^v$s and $Ar^1$s is changed to a different substituent group, it is possible to reproduce a color obtained from a mixture of several kinds of color-forming moieties, so that it is possible to produce a desired color.

An anionic moiety ($B^{c-}$) of the first color material used in the color material dispersion liquid of the first embodiment, is a "c"-valent polyoxometalate anion in which molybdenum and tungsten are contained, and the molar ratio between the molybdenum and the tungsten is 0.4:99.6 to 15:85. An anionic moiety ($B^{c-}$) of the second color material used in the color material dispersion liquid of the second embodiment, is a "c"-valent polyoxometalate anion in which at least tungsten is contained, and the molar ratio of molybdenum to the tungsten is less than 0.4/99.6.

In the present invention, the molar ratio between molybdenum and tungsten represents the molar ratio between molybdenum atoms and tungsten atoms in the whole color material represented by the general formula (I). The molar ratio of molybdenum to tungsten represents the value of the molar ratio of molybdenum atoms to tungsten atoms in the whole color material represented by the general formula (I).

The polyoxometalate anions can be isopolyoxometalate ions $(M_mO_n)^{c-}$ or heteropolyoxometalate ions $(X_lM_mO_n)^{c-}$. In the ionic formulae, M is a polyatom; X is a heteroatom; "m" is the compositional ratio of the polyatom; and "n" is the compositional ratio of an oxygen atom. The polyatom (M) always contains any one of No (molybdenum) or W (tungsten). In the present invention, two or more kinds of polyatoms (M) can be contained. The polyatoms (M) are preferably Mo and/or W. As the heteroatom (X), there may be mentioned Si, P, As, S, Fe, Co, etc. A counter cation such as $Na^+$ or $H^+$ can be contained in a part of the heteroatom.

Concrete examples of the polyoxometalate anions containing molybdenum and/or tungsten include the following: Keggin type phosphotungstic acids such as $\alpha$-$[PW_{12}O_{40}]^{3-}$; Dawson type phosphotungstic acids such as $\alpha$-$[P_2W_{18}O_{62}]^{6-}$ and $\beta$-$[P_2W_{18}O_{62}]^{6-}$; Keggin type silicotungstic acid ions such as $\alpha$-$[SiW_{12}O_{40}]^{4-}$, $\beta$-$[SiW_{12}O_{40}]^{4-}$ and $\gamma$-$[SiW_{12}O_{40}]^{4-}$; and other phosphotungstic acids such as $[P_2W_{17}O_{61}]^{10-}$, $[P_2W_{15}O_{56}]^{12-}$, $[H_2P_2W_{12}O_{48}]^{12-}$, $[NaP_5W_{30}O_{110}]^{14-}$, $\alpha$-$[SiW_9O_{34}]^{10-}$, $\gamma$-$[SiW_{10}O_{36}]^{8-}$, $\alpha$-$[SiW_{11}O_{39}]^{8-}$, $\beta$-$[SiW_{11}O_{39}]^{8-}$, $[W_6O_{19}]^{2-}$, $[W_{10}O_{32}]^{4-}$, $WO_4^{2-}$, $\alpha$-$[PMo_{12}O_{40}]^{3-}$, $\alpha$-$[PW_{11}MoO_{40}]^{3-}$, $\alpha$-$[PW_9Mo_3O_{40}]^{3-}$, $\alpha$-$[PW_3Mo_9O_{40}]^{3-}$, $\alpha$-$[SiMo_{12}O_{40}]^{4-}$, $\alpha$-$[P_2Mo_{18}O_{62}]^{6-}$, $[Mo_2O_7]^{2-}$, $[Mo_6O_{19}]^{2-}$ and $[Mo_8O_{26}]^{4-}$.

Preferred as the anions of the inorganic acid containing molybdenum and/or tungsten is, of the above examples, a heteropolyoxometalate, more preferably a heteropolyoxometalate containing P (phosphorus), from the viewpoint of heat resistance and light resistance and also from the viewpoint of availability of raw materials.

As the polyoxometalate anion contained in the first color material, there may be used only one kind of anions or a combination of two or more kinds of anions selected from the above-exemplified anions. In the case of using two or more kinds of anions in combination, the molar ratio between molybdenum and tungsten in the whole polyoxometalate anions is needed to be 0.4:99.6 to 15:85. From the viewpoint of excellent heat resistance and light resistance, the molar ratio between molybdenum and tungsten is preferably 0.8:99.2 to 13:87, more preferably 1.0:99.0 to 10:90.

As the polyoxometalate anion contained in the second color material, there may be used one kind of anions or a combination of two or more kinds anions selected from the above-exemplified anions. In the case of using two or more kinds anions in combination, the molar ratio of molybdenum to tungsten in the whole polyoxometalate anions is needed to be less than 0.4/99.6. From the point of view that luminance is less likely to decrease upon heating, the molar ratio of molybdenum to tungsten is preferably 0.3/99.7 or less. This range encompasses the case where only tungsten is contained as the polyatoms and molybdenum is not contained, i.e., the case where the molar ratio between molybdenum and tungsten in the polyoxometalate anions is 0:100. The molar ratio of molybdenum to tungsten is preferably 0.05/99.95 or more, more preferably 0.08/99.92 or more.

In the general formula (I), "a" refers to the number of cationic color-forming moieties constituting the cation. In the general formula (I), "a" is an integer of 2 or more. In the color material of the present invention, the cation is divalent or higher, and the anion is also divalent or higher; therefore, the molecular association described above is formed, resulting in an increase in heat resistance and light resistance. On the other hand, the upper limit of "a" is not particularly limited. From the viewpoint of ease of production, "a" is preferably 4 or less, more preferably 3 or less.

In the general formula (I), "b" refers to the number of molecules of cation in the molecular association, and "d" refers to the number of molecules of anion in the molecular association. In the general formula (I), each of "b" and "d" is an integer of 1 or more. In the crystal or aggregate of the color material of the present invention, each of "b" and "d" is not limited to 1 and can be any natural number of 2 or more, such as 2, 3, 4 or so on. From the viewpoint of heat resistance and light resistance, it is preferable that at least a part of the color material of the present invention forms a molecular association in which "b"≥2. In addition, from the viewpoint of heat resistance and light resistance, it is preferable that at least a part of the color material of the present invention forms a molecular association in which "d"≥2.

When "b" is 2 or more, the cations in the molecular association can be of a single kind or a combination of two or more kinds. When "d" is 2 or more, the anions in the molecular association can be a single kind or a combination of two or more kinds, and a combination of an organic anion and an inorganic anion can also be used.

The average dispersed particle size of the color material used in the present invention is not particularly limited in the color material dispersion liquid, as long as the color layer formed with the color material dispersion liquid shows a desired color. From the viewpoint of heat resistance and light resistance, the average dispersed particle size is preferably in a range of 10 to 150 nm, more preferably in a range of 20 to 125 nm. When the average dispersed particle size of the color material is in these ranges, high contrast and high quality are provided to the liquid crystal display device and organic light-emitting display device produced with the color resin composition of the present invention.

The average dispersed particle size of the color material in the color material dispersion liquid is the dispersed particle size of color material particles dispersed in a dispersion medium which contains at least a solvent, and it is measured with a laser scattering particle size distribution analyzer. For example, the particle size can be obtained by diluting appropriately the color material dispersion liquid with the solvent used in the dispersion liquid to a concentration that is measurable with the laser scattering particle size distribution analyzer (e.g., 1,000-fold) and then measuring the particle size with a laser scattering particle size distribution analyzer (e.g., Nanotrac Particle Size Analyzer UPA-EX150 manufactured by Nikkiso Co., Ltd.) by dynamic light scattering at 23° C. Here, "average dispersed particle size" is volume average particle size.

In the color material dispersion liquid of the present invention, the content of the color material is not particularly limited. From the viewpoint of dispersibility and dispersion stability, the content of the color material is preferably in a range of 5 to 40% by mass, more preferably in a range of 10 to 20% by mass, with respect to the total amount of the color material dispersion liquid.

<Method for Producing the Color Material Represented by the General Formula (I)>

The method for producing the color material represented by the general formula (I) is not particularly limited. For example, the color material can be obtained by producing a cationic moiety in the following manner and then introducing a counter anion.

(Synthesis of an Intermediate Represented by the Following Chemical Formula (A))

First, the intermediate represented by the following chemical formula (A), which is a precursor compound of the cationic moiety, is synthesized:

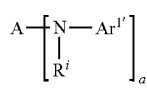

Chemical Formula (A)

wherein A, $R^i$ and "a" are the same as those in the general formula (I) and $Ar^{1'}$ is a structure in which a hydrogen is bound to $Ar^1$ of the general formula (I).

The method for synthesizing the compound represented by the chemical formula (A) is not particularly limited. For example, the compound can be obtained by reacting in a solvent a halogenated aromatic compound having a desired substituent group $Ar^{1'}$ introduced therein, with an "a"-valent amine compound having a desired substituent group A introduced therein, in the presence of a base and a catalyst such as palladium acetate. As the "a"-valent amine compound having a desired substituent group A introduced therein, there may be used various kinds of commercial products. For example, commercial products of trivalent amine compounds include 1,3,5-benzenetrimethanamine and 1,3,5-cyclohexanetrimethanamine manufactured by FCH Group. Commercial products of tetravalent amine compounds include 1,2,4,5-benzenetetramethanamine manufactured by FCH Group, for example.

The amount of the halogenated aromatic compound used in the above reaction can be appropriately adjusted, considering that the reaction ratio between the halogenated aromatic compound having a desired substituent group $Ar^{1'}$ introduced therein and the "a"-valent amine compound having a desired substituent group A introduced therein, is "a":1 (molar ratio). For example, if "a" is desired to be 2, the amount used of the halogenated aromatic compound is preferably 1.5 to 10 molar equivalent, more preferably 1.5 to 3.0 molar equivalent, still more preferably 1.8 to 2.2 molar equivalent, with respect to the amine compound, from the viewpoint of inhibiting generation of by-products and improving the reaction yield.

In the above reaction, the reaction temperature is not particularly limited and is generally around 100 to 150° C. It is preferably 130 to 145° C. from the viewpoint of inhibiting side reactions. Also in the above reaction, the reaction pressure is not particularly limited. It is preferably from an ordinary pressure to 0.1 MPa, more preferably an ordinary pressure.

In the above reaction, the reaction time varies depending on the synthesis amount and the reaction temperature. It is generally set in a range of 6 to 72 hours, preferably 6 to 48 hours.

The base used in the reaction is not particularly limited. The examples include sodium hydroxide, potassium hydrate, potassium carbonate, metal alkoxides and metal amides. Particularly, it is preferable to use a strong base with low nucleophilicity, from the viewpoint of inhibiting side reactions and improving the yield of the base generator. The examples include potassium t-butoxide, sodium t-butoxide, lithium t-butoxide, lithium diisopropylamide, potassium hexamethyldisilazide and lithium tetramethylpiperidide. Of them, potassium t-butoxide is more preferable for use.

The amount of the base added is not particularly limited. With respect to the amine compound, it is generally 2.0 to 4.0 molar equivalent. From the viewpoint of improving the reaction yield, it is preferably 2.5 to 3.5 molar equivalent.

(Synthesis of the Cationic Moiety)

The cationic moiety of the color material represented by the general formula (I) can be obtained in the form of a chloride by reacting the intermediate represented by the chemical formula (A) and a compound represented by the following chemical formula (B) in a solvent, using a chlorinating agent such as phosphorus oxychloride:

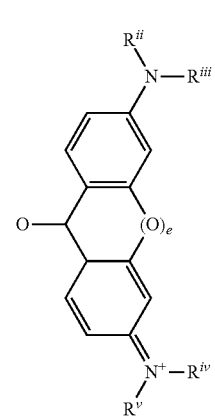

General Formula (B)

wherein $R^i$ to $R^v$ and "e" are the same as those in the general formula (I).

The amount of the compound represented by the chemical formula (B) and used in the above reaction can be appropriately adjusted, considering that the reaction ratio between the compound represented by the chemical formula (B) and the intermediate represented by the chemical formula (A) is a:1 (molar ratio). For example, if "a" is desired to be 2, the amount used of the compound represented by the chemical formula (B) is preferably 1.5 to 4.0 molar equivalent, more preferably 1.5 to 3.0 molar equivalent, still more preferably 1.8 to 2.2 molar equivalent, with respect to the compound represented by the chemical formula (A), from the viewpoint of inhibiting generation of by-products and improving the reaction yield.

The reaction temperature in the above reaction is not particularly limited and is generally around 110 to 150° C. It is preferably 110 to 120° C., from the viewpoint of inhibiting side reactions. The reaction pressure in the above reaction is not particularly limited. It is preferably from an ordinary pressure to 0.1 MPa, more preferably an ordinary pressure. The reaction time in the above reaction varies depending on the amount of synthesis and the reaction temperature. It is generally set in a range of 1 to 10 hours, preferably 1 to 5 hours.

The amount of the phosphorous oxychloride added is not particularly limited. With respect to the compound represented by the chemical formula (A), it is generally 1.5 to 3.0 molar equivalent. From the viewpoint of improving the reaction yield, it is preferably 1.8 to 3.0 molar equivalent.

The first color material is obtained by mixing, in a solvent, the chloride of the cationic moiety obtained by the reaction with one or more kinds of polyoxometalate anions prepared so that the molar ratio between the molybdenum and the tungsten is 0.4:99.6 to 15:85.

The second color material is obtained by mixing, in a solvent, the chloride of the cationic moiety obtained by the reaction with one or more kinds of polyoxometalate anions prepared so that the molar ratio of molybdenum to the tungsten is less than 0.4/99.6.

(Dispersant)

In the color material dispersion liquid of the present invention, the color material represented by the general formula (I) is dispersed in a solvent for use. In the present invention, a dispersant is used to disperse the color material well. The dispersant can be selected from those that are conventionally used as pigment dispersants. As the dispersant, for example, there may be used surfactants such as cationic, anionic, nonionic, amphoteric, silicone-based and fluorine-based dispersing agents. Among surfactants, polymer surfactants (polymer dispersants) are preferred from the viewpoint of homogeneous, fine dispersion.

Examples of polymer dispersants include (co)polymers of unsaturated carboxylic esters such as polyacrylic ester; (partial) amine salts, (partial) ammonium salts or (partial) alkylamine salts of (co)polymers of unsaturated carboxylic acids, such as polyacrylic acid; (co)polymers of hydroxyl group-containing unsaturated carboxylic esters, such as hydroxyl group-containing polyacrylic ester, and modified products thereof; polyurethanes; unsaturated polyamides; polysiloxanes; long-chain polyaminoamide phosphates; polyethyleneimine derivatives (amides obtained by reaction of poly(lower alkyleneimines) and free carboxyl group-containing polyesters, and bases thereof); and polyallylamine derivatives (reaction products obtained by reaction of polyallylamine with one or more compounds selected from the group consisting of the following three compounds: a free carboxyl group-containing polyester, a free carboxyl group-containing polyamide and a free carboxyl group-containing co-condensate of ester and amide (polyester-amide).

Particularly preferred polymer dispersants are polymer dispersants in which a nitrogen atom is contained in a main or side chain thereof, from the point of view that such dispersants can suitably disperse the color material represented by the general formula (I) and has excellent dispersion stability. In the case of using such a dispersant, it is estimated that the dispersant has a role in not only dispersing the color material represented by the general formula (I) well but also making the color material present stably in the state of ion pair or in the state of the above-described molecular association. As a result, the color material dispersion liquid with excellent heat resistance and light resistance is obtained.

Examples of polymer dispersants in which a nitrogen atom is contained in a main or side chain thereof, include (partial) amine salts, (partial) ammonium salts or (partial) alkylamine salts of (co)polymers of unsaturated carboxylic acids, such as polyacrylic acid; polyurethanes; unsaturated polyamides; polyethyleneimine derivatives; and polyallylamine derivatives.

More specifically, Examples of polymer dispersants in which a nitrogen atom is contained in a main or side chain thereof, include the following dispersants.

As the (partial) amine salts, (partial) ammonium salts or (partial) alkylamine salts of (co)polymers of unsaturated carboxylic acids, such as polyacrylic acid, there may be used Disperbyk 2000 and 2001 (these and the following Disperbyk series products are all manufactured by BYK Japan KK), for example.

As the polyurethanes, there may be mentioned Disperbyk 161, for example.

As the unsaturated polyamides, there may be mentioned Disperbyk 101 and 130, for example.

As the polyallylamine derivatives, for example, there may be mentioned commercially-available polyallylamine derivative products such as AJISPER PB821, PB822, PB824 and PB827 (manufactured by Ajinomoto Fine-Techno. Co., Inc.)

As the polyethyleneimine derivatives, there may be mentioned commercially-available polyethyleneimine derivative products such as Solsperse 33500 (manufactured by The Lubrizol Corporation), for example.

Other commercially-available dispersants include, for example, Disperbyk 116, 140, 160, 162, 163, 164, 166, 167, 168, 170, 171, 174, 182 and 2050 (manufactured by BYK Japan KK); EFKA 4046 and 4047 (manufactured by EFKA CHEMICALS); Solsperse 12000, 13250, 13940, 17000, 20000, 24000GR, 24000SC, 27000, 28000, 32000, 33500, 35200, 37500 (manufactured by The Lubrizol Corporation); and AJISPER PB711, 823, 880 (manufactured by Ajinomoto Fine-Techno. Co., Inc.)

From the viewpoint of excellent heat resistance and light resistance, the polymer dispersant in which a nitrogen atom is contained in a main or side chain thereof, is preferably a polymer having a constitutional unit(s) (1) represented by the following general formula (V):

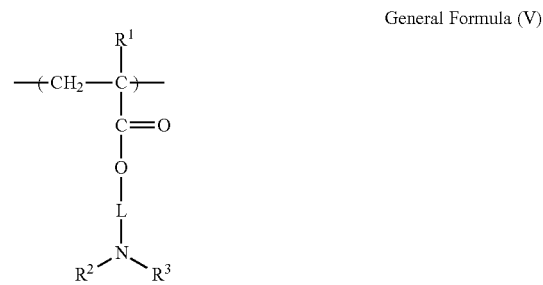

General Formula (V)

wherein $R^1$ is a hydrogen atom or a methyl group; $R^2$ and $R^3$ are each independently a hydrogen atom or an alkyl group having 1 to 8 carbon atoms; L is an alkylene group having 1 to 8 carbon atoms or a divalent group described by —[CH($R^6$)—CH($R^7$)—O]$_x$—CH($R^6$)—CH($R^7$)— or —[(CH$_2$)$_y$—O]$_z$—(CH$_2$)$_y$—; $R^6$ and $R^7$ are each independently a hydrogen atom or a methyl group; the alkyl group and the alkylene group can have a substituent group each; and wherein "x" is an integer of 1 to 18; "y" is an integer of 1 to 5; and "z" is an integer of 1 to 18.

Of polymers having a constitutional unit(s) (1) represented by the general formula (V), from the viewpoint of excellent heat resistance and light resistance, a graft copolymer in which a nitrogen-containing monomer represented by the following general formula (V') and a macromonomer containing a polymer chain and at a terminal thereof a group that has an ethylenically unsaturated double bond are contained as copolymerizable components, is preferred:

General Formula (V')

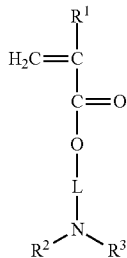

wherein $R^1$, $R^2$, $R^3$ and L are the same as those in the formula (V).

When $R^2$ and $R^3$ are an alkyl group having 1 to 8 carbon atoms, the alkyl group is not particularly limited, and examples thereof include an ethyl group, an n-propyl group, an isopropyl group, an n-butyl group, an isobutyl group, a sec-butyl group, a tert-butyl group, various kinds of pentyl groups, various kinds of hexyl groups, various kinds of octyl groups, a cyclopentyl group, a cyclohexyl group, and a cyclooctyl group. Of them, preferred are a methyl group and an ethyl group.

$R^2$ and $R^3$ can be the same as or different from each other.

L is an alkylene group having 1 to 8 carbon atoms or a divalent group described by *—[CH($R^6$)—CH($R^7$)—O]$_x$—CH($R^6$)—CH($R^7$)—** or *—[(CH$_2$)$_y$—O]$_z$—(CH$_2$)$_y$—** (wherein * represents a linking site on the ester bond side, and ** represents a linking site on the amino group side). When L is an alkylene group having 1 to 8 carbon atoms, it can be a straight-chain or branched-chain alkylene group having 1 to 8 carbon atoms, such as a methylene group, an ethylene group, a trimethylene group, a propylene group, various kinds of butylene groups, various kinds of pentylene groups, various kinds of hexylene groups, and various kinds of octylene groups. Arylene groups include a phenylene group. From the viewpoint of keeping the dispersibility of the color material excellent, L is preferably an alkylene group having 1 to 8 carbon atoms, more preferably a methylene group or an ethylene group.

Also, "x" is an integer of 1 to 18, preferably an integer of 1 to 4, more preferably an integer of 1 or 2; "y" is an integer of 1 to 5, preferably an integer of 1 to 4, more preferably 2 or 3; and "z" is an integer of 1 to 18, preferably an integer of 1 to 4, more preferably an integer of 1 or 2. In the present invention, as long as "x", "y" and "z" are in the above ranges, the color material dispersion liquid and the color resin composition of the present invention have excellent color material dispersibility and excellent heat resistance and light resistance.

The macromonomer is composed of a polymer chain and at a terminal thereof a group that has an ethylenically unsaturated double bond. It is preferable that the group that has an ethylenically unsaturated double bond is present only at a terminal of the polymer chain (hereinafter may be referred to as "single terminal"). The macromonomer can be substituted by a substituent group, such as a halogen atom, within a scope which does not impair the dispersion performance and so on of the graft copolymer.

Preferred examples of the group that has an ethylenically unsaturated double bond include a (meth)acryloyl group, a vinyl group and an allyl group. Of them, a (meth)acryloyl group and a vinyl group are more preferred, and a (meth)acryloyl group is particularly preferred.

The polymer chain of the macromonomer preferably has at least one kind of constitutional unit(s) represented by the following general formulae (VI) or (VII):

General Formula (VI)

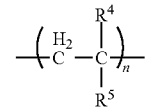

General Formula (VII)

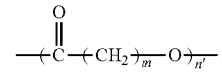

wherein $R^4$ is a hydrogen atom or a methyl group; $R^5$ is an alkyl group having 1 to 18 carbon atoms, an aralkyl group, an aryl group, a cyano group, or a monovalent group described by —[CH($R^6$)—CH($R^7$)—O]$_x$—$R^8$, —[(CH$_2$)$_y$—O]$_z$—$R^8$, —[CO—(CH$_2$)$_y$—O]$_z$—$R^8$, —CO—O—$R^9$ or —O—CO—$R^{10}$; $R^6$ and $R^7$ are each independently a hydrogen atom or a methyl group;

wherein $R^8$ is a hydrogen atom, an alkyl group having 1 to 18 carbon atoms, an aralkyl group, an aryl group, or a monovalent group described by —CHO, —CH$_2$CHO or —CH$_2$COOR$^{11}$; $R^9$ is an alkyl group having 1 to 18 carbon atoms, an aralkyl group, an aryl group, a cyano group, or a monovalent group described by —[CH($R^6$)—CH($R^7$)—O]$_x$—$R^8$, —[(CH$_2$)$_y$—O]$_z$—$R^8$ or —[CO—(CH$_2$)$_y$—O]$_z$—$R^8$; $R^{10}$ is an alkyl group having 1 to 18 carbon atoms; and $R^{11}$ is a hydrogen atom or an alkyl group having 1 to 5 carbon atoms; and wherein "m" is an integer of 1 to 5; "n" and "n'" are each an integer of 5 to 200; "x" is an integer of 1 to 18; "y" is an integer of 1 to 5; and "z" is an integer of 1 to 18.

When $R^5$ is an alkyl group having 1 to 18 carbon atoms, it can be a straight-chain, branched-chain or cyclic alkyl group having 1 to 18 carbon atoms, and examples thereof include a methyl group, an ethyl group, an n-propyl group, an isopropyl group, an n-butyl group, an isobutyl group, a sec-butyl group, a tert-butyl group, various kinds of pentyl groups, various kinds of hexyl groups, various kinds of octyl groups, various kinds of decyl groups, various kinds of dodecyl groups, various kinds of tetradecyl groups, various kinds of hexadecyl groups, various kinds of octadecyl groups, a cyclopentyl group, a cyclohexyl group, a cyclooctyl group, a cyclododecyl group, a bornyl group, an isobornyl group, a dicyclopentanyl group, an adamantyl group, and a lower alkyl group-substituted adamantyl group.

When $R^5$ is an aryl group, examples thereof include a phenyl group, a biphenyl group, a naphthyl group, a tolyl group and a xylyl group. The aryl group preferably has 6 to 24 carbon atoms, more preferably 6 to 12 carbon atoms.

When $R^5$ is an aralkyl group, examples thereof include a benzyl group, a phenethyl group, a naphthylmethyl group and a biphenylmethyl group. The aralkyl group preferably has 7 to 20 carbon atoms, more preferably 7 to 14 carbon atoms.

When $R^5$ has an aromatic ring, $R^5$ can further have a substituent group on the aromatic ring, such as a straight-chain or branched-chain alkyl group having 1 to 4 carbon atoms, an alkenyl group, a nitro group or a halogen atom.

When $R^9$ is an alkyl group having 1 to 18 carbon atoms, an aralkyl group or an aryl group, they can be the same as above described as for $R^5$.

Also, "x", "y" and "z" in $R^5$ and $R^9$ are the same as those in A described above.

When $R^8$ is a monovalent group, examples of the substituent group $R^8$ can have include a straight-chain, branched-chain or cyclic alkyl group having 1 to 4 carbon atoms, and halogen atoms such as F, Cl and Br.

When $R^{10}$ and $R^8$ are an alkyl group having 1 to 18 carbon atoms, an aralkyl group or an aryl group, they are the same as those in $R^5$ described above.

$R^{11}$ is a hydrogen atom or a straight-chain, branched-chain or cyclic alkyl group having 1 to 5 carbon atoms.

In the present invention, as $R^5$ and $R^9$, it is preferable to use a group with excellent solubility in a solvent described below. When the solvent is an ether alcohol acetate-based, ether-based or ester-based solvent that is generally used as a solvent for color filters, depending on the constitutional units or the like constituting the graft copolymer, concrete examples of the group include a methyl group, an ethyl group, an n-butyl group, a 2-ethylhexyl group and a benzyl group.

The reason why $R^5$ and $R^9$ are determined as above is that particularly excellent color material dispersibility and stability can be obtained when the constitutional units containing $R^5$ and $R^9$ is soluble in the solvent and the amino group of the monomer has high adsorption to the color material.

Also, within a scope which does not impair the dispersion performance and so on of the graft copolymer, $R^5$ and $R^9$ can be one substituted by a substituent group such as an alkoxy group, a hydroxyl group, a carboxyl group, an amino group, an epoxy group, an isocyanate group or a hydrogen bond-forming group. Also, after the synthesis of the graft copolymer having such a substituent group, a polymerizable group can be added to the graft copolymer by reacting the copolymer with a compound having a functional group that is reactive with the above-mentioned substituent group and a polymerizable group. For example, a polymerizable group can be added by reaction of a graft copolymer having a carboxyl group a glycidyl (meth)acrylate, or by reaction with a block copolymer having an isocyanate group with hydroxyethyl (meth)acrylate.

The polymer chain of the macromonomer preferably has a glass transition temperature of 30° C. or more, more preferably 50° C. or more. When the polymer chain of the macromonomer has a glass transition temperature of 30° C. or more, the heat resistance and light resistance of the color layers formed by using the color material dispersion liquid or color resin composition of the present invention are increased. When the heat resistance is increased, it is possible to prevent the color layers from discoloration or decrease in luminance or contrast after a post-baking process (e.g., heating at 200° C. for 30 minutes) in the color filter production.

In the present invention, the glass transition temperature (Tg) of the polymer chain of the macromonomer can be calculated by the following equation:

$$1/Tg = \Sigma(Xi/Tgi)$$

In this case, "n" monomer components are copolymerized in the polymer ("i"=1 to "n" and "n" is the number of the monomer component(s)). Xi is the mass fraction ($\Sigma Xi=1$) of the "i"-th monomer. Tgi is the glass transition temperature (absolute temperature) of the homopolymer of the "i"-th monomer. It is noted that $\Sigma$ is the sum of "i"=1 to "n".

As the value (Tgi) of the glass transition temperature of the homopolymer of each monomer, there may be used the value described in Polymer Handbook (3rd Edition) (J. Brandrup, E. H. Immergut (Wiley-Interscience, 1989)).

Considering the above points, the polymer chain of the macromonomer is preferably one in which the total amount of the constitutional units derived from one or more kinds of monomers selected from the group consisting of, of the above-mentioned constitutional units, methyl methacrylate, ethyl methacrylate, isopropyl methacrylate, isobutyl methacrylate, tert-butyl methacrylate, cyclohexyl methacrylate, benzyl (meth)acrylate, phenyl (meth)acrylate, isobornyl (meth)acrylate, dicyclopentanyl (meth)acrylate, adamantyl (meth)acrylate, styrene, α-methylstyrene and vinylcyclohexane accounts for 30% by mass or more of the whole polymer chains of the macromonomer, more preferably 50% by mass or more of the whole polymer chains of the macromonomer, and still more preferably one in which the constitutional units derived from methyl methacrylate, benzyl (meth)acrylate, phenyl (meth)acrylate, cyclohexyl (meth)acrylate and/or isobornyl (meth)acrylate are contained. However, the polymer chain of the macromonomer is not limited to them.

The polymer chain of the macromonomer can be a homopolymer or copolymer.

For example, even in the case of a constitutional unit which shows a glass transition temperature of less than 30° C. in a homopolymer, when the unit is contained as a copolymerizable component of the polymer chain and the glass transition temperature (Tg) of the whole polymer chain calculated by the above equation is 30° C. or more, the constitutional unit can be suitably used as the macromonomer in the color resin composition of the present invention.

Also, the macromonomer used in the graft copolymer can be one kind of macromonomer or two or more kinds of macromonomers in combination.

In the case of using two or more kinds of macromonomers in combination, the macromonomers having a polymer chain that has a glass transition temperature of 30° C. or more preferably accounts for 50% by mass or more of the whole macromonomers, more preferably 70% by mass or more of the whole macromonomers.

In the general formula (VI) or (VII), "m" is an integer of 1 to 5, preferably an integer of 2 to 5, more preferably an integer of 4 or 5. The unit numbers "n" and "n'" of the constitutional unit(s) of the macromonomer are needed to be an integer of 5 to 200, and they are preferably, but not limited to, in a range of 5 to 100.

The mass average molecular weight Mw of the macromonomer is preferably in a range of 500 to 20,000, more preferably in a range of 1,000 to 10,000. When the mass average molecular weight is in the range, the dispersant can maintain sufficient steric repulsion and prevent an increase in the time required for adsorption to the color material by steric effects.

Such a macromonomer can be one synthesized appropriately or a commercially-available product. Examples of the commercially-available product include a single terminal methacryloylated polymethylmethacrylate oligomer (mass average molecular weight 6000, "AA-6" (product name) manufactured by TOAGOSEI Co., Ltd.), a single terminal methacryloylated poly-n-butyl acrylate oligomer (mass average molecular weight 6000, "AB-6" (product name) manufactured by TOAGOSEI Co., Ltd.), a single terminal methacryloylated polystyrene oligomer (mass average molecular weight 6000, "AS-6" (product name) manufactured by TOAGOSEI Co., Ltd.), a caprolactone-modified hydroxyethyl methacrylate ("PLACCEL FM5" (product name) manufacture by DAICEL Chemical Industries, Ltd.) and a caprolactone-modified hydroxyethyl acrylate ("PLACCEL FA10L" (product name) manufactured by DAICEL Chemical Industries, Ltd.)

Well-known methods for synthesizing such a macromonomer include a living polymerization method and a radical polymerization method using a chain transfer agent. The radical polymerization method is easier to use since it provides a wider range of monomer choice. For example, by radical polymerization of a monomer in the presence of a chain transfer agent having a carboxyl group, such as mercaptopropionic acid, an oligomer having a carboxyl group at the single terminal is obtained. By adding glycidyl methacrylate to this oligomer, an oligomer having a methacryloyl group at the single terminal, i.e., macromonomer, is obtained.

In the graft copolymer, the constitutional unit(s) derived from the nitrogen-containing monomer preferably accounts for 3 to 80% by mass, more preferably 5 to 50% by mass, still more preferably 10 to 40% by mass of the graft copolymer. When the content of the constitutional unit(s) derived from the nitrogen-containing monomer in the graft copolymer is in the range, the ratio of the salt-forming site(s) formed by the amino groups in the graft copolymer becomes an appropriate ratio, and a decrease in solubility in solvent can be inhibited by the side chain of the macromonomer. Therefore, good adsorption to the color material and thus excellent color material dispersibility and stability are obtained.

The mass average molecular weight Mw of the graft copolymer is preferably in a range of 1,000 to 100,000, more preferably in a range of 3,000 to 50,000, still more preferably 5,000 to 30,000. When the weight average molecular weight is in the range, the color material can be homogeneously dispersed.

The mass average molecular weight Mw is a value measured by gel permeation chromatography (GPC). The measurement was carried out in the following condition:

Measurement system: HLC-8120GPC (manufactured by Tosoh Corporation)

Elution solvent: N-methylpyrrolidone mixed with 0.01 mol/L lithium bromide

Polystyrene standards for the calibration curve: Mw377400, 210500, 96000, 50400, 206500, 10850, 5460, 2930, 1300, 580 (Easi PS-2 Series manufactured by Polymer Laboratories) and Mw1090000 (manufactured by Tosoh Corporation)

Measurement column: TSK-GEL ALPHA-M (manufactured by Tosoh Corporation, the number of used columns: 2)

From the viewpoint of increasing color material dispersibility and obtaining excellent heat resistance and light resistance, the polymer having the constitutional unit(s) (1) represented by the general formula (V) is preferably a polymer in which the amino group of the constitutional unit forms a salt with the organic acid compound represented by the general formula (VIII) and/or (IX). It is more preferable that it is a graft copolymer in which the amino group of the nitrogen-containing monomer of the graft copolymer forms a salt with the organic acid compound represented by the following formula (VIII) and/or (IX) (hereinafter may be referred to as salt type graft copolymer):

General Formula (VIII)

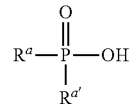

General Formula (IX)

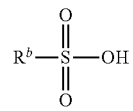

wherein $R^a$ and $R^{a'}$ are each independently a hydrogen atom, a hydroxyl group, an alkyl group having 1 to 18 carbon atoms, an alkenyl group having 2 to 18 carbon atoms, an aralkyl group, an aryl group or a monovalent group described by $-[CH(R^c)-CH(R^d)-O]_s-R^e$, $-[(CH_2)_t-O]_u-R^e$ or $-O-R^{a''}$; any one of $R^a$ and $R^{a'}$ contains a carbon atom; and $R^{a''}$ is an alkyl group having 1 to 18 carbon atoms, an alkenyl group having 2 to 18 carbon atoms, an aralkyl group, an aryl group or a monovalent group described by $-[CH(R^c)-CH(R^d)-O]_s-R^e$ or $-[(CH_2)_t-O]_u-R^e$;

wherein $R^b$ is an alkyl group having 1 to 18 carbon atoms, an alkenyl group having 2 to 18 carbon atoms, an aralkyl group, an aryl group or a monovalent group described by $-[CH(R^c)-CH(R^d)-O]_s-R^e$, $-[(CH_2)_t-O]_u-R^e$ or $-O-R^{b'}$; and $R^{b'}$ is an alkyl group having 1 to 18 carbon atoms, an alkenyl group having 2 to 18 carbon atoms, an aralkyl group, an aryl group or a monovalent group described by $-[CH(R^c)-CH(R^d)-O]_s-R^e$ or $-[(CH_2)_t-O]_u-R^e$;

wherein $R^c$ and $R^d$ each independently a hydrogen atom or a methyl group; $R^e$ is a hydrogen atom, an alkyl group having 1 to 18 carbon atoms, an alkenyl group having 2 to 18 carbon atoms, an aralkyl group, an aryl group or a monovalent group described by $-CHO$, $-CH_2CHO$, $-CO-CH=CH_2$, $-CO-C(CH_3)=CH_2$ or $-CH_2COOR^f$; $R^f$ is a hydrogen atom or an alkyl group having 1 to 5 carbon atoms; and when $R^a$, $R^{a'}$ and $R^b$ are an alkyl group, an alkenyl group, an aralkyl group or an aryl group, the group can have a substituent group; and wherein "s" is an integer of 1 to 18; "t" is an integer of 1 to 5; and "u" is an integer of 1 to 18.

When $R^a$ and/or $R^{a'}$ is $-O-R^{a''}$, it becomes an acidic phosphoric acid ester. When $R^b$ is $-O-R^{b'}$, it becomes an acidic sulfuric acid ester.

When $R^a$, $R^{a'}$, $R^{a''}$ and $R^b$ have an aromatic ring each, they can have an appropriate substituent group on the aromatic ring, such as a straight-chain or branched-chain alkyl group.

The alkyl group having 1 to 18 carbon atoms, the aralkyl group and the aryl group are the same as those in $R^5$ described above.

The alkenyl group having 2 to 18 carbon atoms can be any one of straight-chain, branched-chain or cyclic alkenyl groups having 2 to 18 carbon atoms. Examples of such alkenyl groups include a vinyl group, an allyl group, a propenyl group, various kinds of butenyl groups, various kinds of hexenyl groups, various kinds of octenyl groups, various kinds of decenyl groups, various kinds of dodecenyl groups, various kinds of tetradecenyl groups, various kinds of hexadecenyl groups, various kinds of octadecenyl groups, a cyclopentenyl group, a cyclohexenyl group and a cyclooctenyl group. The position of the double bond of the alkenyl group is not particularly limited. From the viewpoint of reactivity of the polymer thus obtained, it is preferable that a double bond is present at the terminal of the alkenyl group.

When $R^e$ is a monovalent group, examples of the substituent group $R^e$ can have include a straight-chain, branched-chain or cyclic alkyl group having 1 to 4 carbon atoms, and halogen atoms such as F, Cl and Br.

In $R^a$, $R^{a'}$ and $R^{a''}$, "s" is an integer of 1 to 18; "t" is an integer of 1 to 5; and "u" is an integer of 1 to 18. Also, is preferably an integer of 1 to 4, more preferably an integer of 1 or 2; "t" is preferably an integer of 1 to 4, more preferably 2 or 3; and "u" is preferably an integer of 1 to 4, more preferably an integer of 1 or 2.

From the viewpoint of increasing color material dispersibility and providing high contrast and excellent heat resistance to the color layers thus obtained, the organic acid compound represented by the general formula (VIII) is preferably one in which $R^a$ and $R^{a'}$ are each independently a hydrogen atom, a hydroxyl group, a methyl group, an ethyl group, an aryl or aralkyl group which can have a substituent group, a vinyl group, an allyl group, or a monovalent organic group represented by $-[CH(R^c)-CH(R^d)-O]_s-R^e$, $-[(CH_2)_t-O]_u-R^e$ or $-O-R^{a''}$; any one of $R^a$ and $R^{a'}$ contains a carbon atom; $R^{a''}$ is a methyl group, an ethyl group, an aryl or aralkyl group which can have a substituent group, a vinyl group, an allyl group, $-[CH(R^c)-CH(R^d)-O]_s-R^e$ or $-[(CH_2)_t-O]_u-R^e$; $R^c$ and $R^d$ each independently a hydrogen atom or a methyl group; and $R^e$ is $-CO-CH=CH_2$ or $-CO-C(CH_3)=CH_2$ From the viewpoint of increasing color material dispersibility and providing high contrast and excellent heat resistance to the color layers thus obtained, the organic acid component represented by the general formula (IX) is preferably one in which $R^b$ is a methyl group, an ethyl group, an aryl or aralkyl group which can have a substituent group, a vinyl group, an allyl group, or a monovalent group described by $-[CH(R^c)-CH(R^d)-O]_s-R^e$, $-[(CH_2)_t-O]_u-R^e$ or $-O-R^{b'}$; $R^{b'}$ is a methyl group, an ethyl group, an aryl or aralkyl group which can have a substituent group, a vinyl group, an allyl group, $-[CH(R^c)-CH(R^d)-O]_s-R^e$ or $-[(CH_2)_t-O]_u-R^e$; $R^c$ and $R^d$ are each independently a hydrogen atom or a methyl group; and $R^e$ is $-CO-CH=CH_2$ or $-CO-C(CH_3)=CH_2$.

From the viewpoint of increasing color material dispersibility and providing high contrast and excellent heat resistance to the color layers thus produced, the organic acid compounds represented by the general formulae (VIII) and (IX) are preferably such that $R^a$, $R^{a'}$ and/or $R^{a''}$, and/or $R^b$ and/or $R^{b'}$ has an aromatic ring. From the viewpoint of color material dispersibility, at least one of $R^a$, $R^{a'}$ and $R^{a''}$, or $R^b$ or $R^{b'}$ is preferably an aryl or aralkyl group which can have a substituent group, in particular, a benzyl group, a phenyl group, a tolyl group, a naphthyl group or a biphenyl group. An organic acid compound represented by the general formula (VIII) in which, when one side of $R^a$ and $R^{a'}$ has an aromatic ring, the other has a hydrogen atom or hydroxyl group, can be also suitably used.

From the viewpoint of heat resistance, chemical resistance and particularly alkali resistance, the organic acid compounds represented by the general formulae (VIII) and (IX) are preferably compounds in which a carbon atom is directly bound to phosphorus (P) or sulfur (S). It is also preferable that $R^a$ and $R^{a'}$ are each independently a hydrogen atom, a hydroxyl group, an alkyl group having 1 to 18 carbon atoms, an alkenyl group having 2 to 18 carbon atoms, an aralkyl group, an aryl group or a monovalent group described by $-[CH(R^c)-CH(R^d)-O]_a-R^e$ or $-[(CH_2)_t-O]_u-R^e$; any one of $R^a$ and $R^{a'}$ contains a carbon atom; and $R^b$ is an alkyl group having 1 to 18 carbon atoms, an alkenyl group having 2 to 18 carbon atoms, an aralkyl group, an aryl group or a monovalent group described by $-[CH(R^c)-CH(R^d)-O]_s-R^e$ or $-[(CH_2)_t-O]_u-R^e$.

The organic acid compounds represented by the general formulae (VIII) and (IX) are preferably one in which $R^a$, $R^{a'}$ and/or $R^{a''}$, and/or $R^b$ and/or $R^{b'}$ is a polymerizable group. Examples of the polymerizable group include a radical polymerizable group and a cationic polymerizable group containing a cyclic ether-containing group such as an oxirane ring or oxetane ring. Preferred is a radical polymerizable group, and more preferred is an ethylenically unsaturated bond-containing group. Preferable examples of ethylenically unsaturated bond-containing groups include a vinyl group, an allyl group, $-[CH(R^c)-CH(R^d)-O]_s-R^e$ and $-[(CH_2)_t-O]_u-R^e$, in which $R_e$ is $-CO-CH=CH_2$ or $-CO-C(CH_3)=CH_2$. Particularly preferred is one in which $R^a$, $R^{a'}$ and/or $R^{a''}$, and/or $R^b$ and/or $R^{b'}$ is a vinyl group, an allyl group, a 2-methacryloyloxyethyl group, or a 2-acryloyloxyethyl group.

In this case, at the time of exposure that is carried out upon forming color layers using the color resin composition for color filters of the present invention, the composition containing a photosensitive binder mentioned below, the polymerizable groups can be readily polymerized with each other, and/or the polymerizable groups can be readily polymerized with an alkali-soluble resin, polyfunctional monomer or the like that is contained in the color resin composition for color filters of the present invention. Moreover, the dispersant is allowed to be stably present in the color layers of a color filter. Therefore, when a liquid crystal display device is produced by use of such a color filter, the bleed out of the dispersant to the liquid crystal layer, etc., can be prevented.

Because the organic acid compound contains the polymerizable groups, the polymerizable groups of the organic acid compound can be polymerized before being used for formation of color layers, thus increasing the molecular weight of the dispersant. Therefore, at the time of development for color layer formation, the color resin composition for color filters in unexposed portions can be one with particularly excellent alkali developability.

The content of the organic acid compound in the salt type graft copolymer is not particularly limited, as long as excellent dispersion stability is obtained. The content is generally about 0.1 to 5.0 molar equivalent, preferably 0.2 to 4.0 molar equivalent, still more preferably 0.3 to 3.5 molar equivalent, with respect to the amino groups contained in the constitutional units derived from the nitrogen-containing monomer. In this case, the color material dispersibility is increased, and high contrast and excellent heat resistance are provided to the color layers thus obtained. In the case of using two or more kinds of the organic acid components, the total content is needed to be in the above range.

<Production of Salt-Type Graft Copolymer>

In the present invention, the method for producing a salt-type graft copolymer which is preferably used as the dispersant is not particularly limited, as long as it is a method that is able to produce a salt-type graft copolymer in which the monomer having an amino group and the macromonomer containing the polymer chain and at a terminal thereof the group that has an ethylenically unsaturated double bond are contained as copolymerizable components, and in which the amino group of the nitrogen-containing monomer forms a salt with the organic acid compound. In the present invention, for example, graft-polymerization of the monomer, the macromonomer and, as needed, other monomer can be carried out by a known polymerization technique. Then, the organic acid compound is added to the solvent and agitated, thereby producing a salt-type graft copolymer. In the polymerization, additives that are generally used for polymerization, such as a polymerization initiator, a dispersion stabilizer and a chain transfer agent, can be used.

In the present invention, as the dispersant, one kind of dispersant can be used alone or two or more kinds of dispersants can be used in combination. The content of the dispersant is appropriately determined, depending on the type of the color material used and on the solid content concentration, etc., of the color resin composition. In the color material dispersion liquid for color filters of the present invention and the color resin composition for color filters of the present invention, the dispersant is generally in a range of 5 to 200 parts by mass, preferably 10 to 100 parts by mass, more preferably 20 to 80 parts by mass, with respect to 100 parts by mass of the color material. When the content is in the range, the color material can be homogeneously dispersed. In the color resin composition, the content ratio of the alkali soluble resin and the polyfunctional monomer is not relatively decreased, so that color layers with sufficient hardness are formed.

(Solvent)

The solvent used in the present invention is a solvent in which the color material represented by the general formula (I) is substantially insoluble or hardly soluble, and is also a solvent having a solubility of the color material of 0.1 (mg/10 g solvent) or less at 23° C. By using such a solvent in the color material dispersion liquid of the present invention, the color material can be dispersed and used in the form of particles (aggregates) in the solvent. In the present invention, the color material dispersion liquid has excellent solvent resistance and electric reliability because the color material represented by the general formula (I) is dispersed in the solvent, with keeping its aggregation state, and used. The solvent is preferably one having a solubility of the color material of 0.1 (mg/10 g solvent) or less at 23° C., more preferably one in which the color material is substantially insoluble.

In the present invention, the solvent having a solubility of the color material represented by the general formula (I) of 0.1 (mg/10 g solvent) or less at 23° C., can be simply determined by the following evaluation method.

First, 10 g of a solvent to be evaluated and then 0.1 g of the color material are put in a 20 mL sample tube. The tube is covered with a lid, shaken well for 20 seconds, and then left in a water bath at 23° C. for 10 minutes. Then, 5 g of the supernatant is filtered to remove insoluble substances. The thus-obtained filtrate is diluted by 1,000 times. Then, the diluted solution is measured for absorption spectrum, using a 1 cm cell in an ultraviolet and visible spectrophotometer (product name: UV-2500PC; manufactured by: Shimadzu Corporation) to calculate the absorbance at the maximum absorption wavelength. At this time, if the absorbance at the maximum absorption wavelength is less than 2, it can be evaluated that the solvent is a solvent having a solubility of the color material represented by the general formula (I) of 0.1 (mg/10 g solvent) or less at 23° C. (that is, a hardly-soluble solvent).

Also in the above evaluation method, the absorption spectrum is measured in the same manner as described above, without diluting the obtained filtrate, to calculate the absorbance at the maximum absorption wavelength. At this time, if the absorbance at the maximum absorption wavelength is less than 2, it can be evaluated that the solvent is a solvent which does not substantially dissolve the color material represented by the general formula (I).

The solvent having a solubility of the color material of 0.1 (mg/10 g solvent) or less at 23° C. is not particularly limited, as long as it is a solvent which does not substantially dissolve the color material represented by the general formula (I) or is a hardly-soluble solvent. The solvent can be appropriately selected for use from solvents which are not reactive with the components in the color material dispersion liquid and which can dissolve or disperse them.

In the color material dispersion liquid of the present invention, it is preferable to use an ester solvent, from the viewpoint of dispersion stability.

Examples of ester solvents include ethyl acetate, butyl acetate, methyl methoxypropionate, ethyl ethoxypropionate, ethyl lactate, methoxyethyl acetate, propylene glycol monomethyl ether acetate, 3-methoxy-3-methyl-1-butyl acetate, 3-methoxybutyl acetate, methoxybutyl acetate, ethoxyethyl acetate and ethyl cellosolve acetate.

These solvents can be used alone or in combination of two or more kinds.

The color material dispersion liquid of the present invention is prepared by using the above-described solvent generally at a ratio of 60 to 85% by mass, with respect to the total amount of the color material dispersion liquid containing the solvent. As the solvent amount decreases, the viscosity increases and the dispersibility decreases. As the solvent amount increases, the color material concentration decreases, possibly resulting in a difficulty in achieving a target chromaticity coordinate after preparation of the resin composition.

(Other Components)

The color material dispersion liquid of the present invention can further contain a pigment, a dye, a dispersion assisting resin and other components, as needed.

The pigment and dye are added to control color tone, as needed. They can be selected from conventionally-known pigments and dyes, according to the purpose, and such pigments can be used alone or in combination of two or more kinds, as well as dyes. The content of the pigment and dye are not particularly limited, as long as the effects of the present invention are not undermined. The amounts can be the same as the color resin composition for color filters, which will be described below.

As the dispersion assisting resin, there may be mentioned an alkali-soluble resin for example, which will be mentioned below under "Color resin composition color filters". The particles of the color material becomes less likely to contact with each other due to steric hindrance by the alkali soluble resin, resulting in stabilization of particle dispersion, and the particle dispersion stabilization effect may be effective in reducing the dispersant.

Other components include a surfactant, which is used to increase wettability, a silane coupling agent, which is used to increase adhesion properties, a defoaming agent, a cissing inhibitor, an antioxidant, an aggregation inhibitor and an ultraviolet absorber, for example.

<Method for Producing the Color Material Dispersion Liquid>

The color material dispersion liquid of the present invention is prepared as follows: the dispersant is mixed with the solvent and agitated to prepare a dispersant solution; the dispersant solution is mixed with the color material and, as needed, other compounds; and the mixture is dispersed with a disperser, thereby obtaining the color material dispersion liquid. The color material dispersion liquid of the present invention can be also prepared by mixing the color material and the dispersant with the solvent and dispersing the mixture with a known disperser.

As the disperser for dispersion treatment, there may be mentioned roll mills such as a two-roll mill and a three-roll mill, ball mills such as a vibrating ball mill, paint conditioners, bead mills such as a continuous disk type bead mill and a continuous annular type bead mill, for example. In the case of using a bead mill, a preferred dispersion condition is that the diameter of beads is 0.03 to 2.00 mm, more preferably 0.10 to 1.0 mm.

In particular, a preliminary dispersion is performed with 2 mm zirconia beads, which is a relatively large bead diameter, and then a main dispersion is further performed with 0.1 mm zirconia beads, which is a relatively small bead diameter. It is preferable to perform filtration with a 0.1 to 0.5 μm membrane filter after the dispersion treatment.

In the present invention, the dispersion time for dispersion with a known disperser is appropriately controlled and is not particularly limited. However, the dispersion time is preferably 5 to 40 hours, from the viewpoint of making the color material represented by the general formula (I) finer and minuter and thus obtaining a high transmittance.

The color material dispersion liquid is obtained in the manner described above, in which the color material particles have excellent dispersibility. The color material dispersion liquid is used as a pre-prepared product for preparing the color resin composition for color filters, which has excellent dispersibility.

The color material dispersion liquid is used as a preliminary prepared product for preparing the below-mentioned color resin composition. That is, the color material dispersion liquid is one which is preliminarily prepared at the step prior to the preparation of the below-mentioned color resin composition and in which the (mass of the color material in the composition)/(mass of solid contents other than the color material in the composition) ratio is high. More specifically, the (mass of the color material in the composition)/(mass of solid contents other than the color material in the composition) ratio is generally 1.0 or more. By mixing the color material dispersion liquid with at least a binder component, a color resin composition with excellent dispersibility can be prepared.

[Color Resin Composition for Color Filters]

The color resin composition for color filters according to the present invention contains the color material dispersion liquid of the present invention, a binder component and a solvent.

According to the present invention, because of containing the color material dispersion liquid of the present invention, the color resin composition thus provided has high uniformity, with achieving higher luminance as that of dyes; therefore, color layers with excellent heat resistance and light resistance can be formed. The color resin composition containing the color material dispersion liquid of the first embodiment is characterized by being particularly excellent in light resistance. The color resin composition containing the color material dispersion liquid of the second embodiment is characterized by being particularly able to prevent a decrease in the luminance of the color layers heated at high temperature.

Also, excellent developing properties can be obtained when the color resin composition for color filters of the present invention is made into the below-described photosensitive resin composition. A cation dye is generally subjected a decrease in solubility in alkaline aqueous solutions upon development, by an electrostatic interaction between acrylic acid groups in the below-described alkali soluble resin and cations of the dye. Especially when a cation dye is uniformly dissolved in a resin composition, the resin composition is very affected by the interaction and shows poor solubility in developing solutions. In the color resin composition for color filters of the present invention, however, since the color material represented by the general formula (I) is dispersed by the dispersant, the fine particles of the color material are covered with the dispersant and its steric hindrance prevents the electrostatic interaction between the color material fine particles and the acrylic acid groups of the alkali soluble resin; therefore, the color resin composition for color filters of the present invention is estimated to have sufficient solubility in developing solutions.

The color resin composition of the present invention contains at least the above-mentioned color material dispersion liquid, a binder component and a solvent, and it can contain other compounds as needed.

Hereinafter, the components of the color resin composition will be described in detail.

In the color resin composition for color filters of the present invention, the components which can be contained in the color material dispersion liquid of the present invention can be the same components as those that have been described above under "Color material dispersion liquid", so that the components will not be described below.

(Solvent)

The solvent used in the color resin composition for color filters of the present invention is not particularly limited, as long as the effects of the present invention are not undermined. Especially from the viewpoint of excellent dispersibility of the color material, the solvent is preferably a solvent having a solubility of the color material of 0.1 (mg/10 g solvent) or less at 23° C., more preferably a solvent having a solubility of the color material of 0.01 (mg/10 g solvent) or less at 23° C., still more preferably one in which the color material is substantially insoluble. The solvent preferably used in the color resin composition for color filters can be the same as the solvent used in the color material dispersion liquid.

(Binder Component)

To provide film-forming and surface adhesion properties and to provide sufficient hardness to coating films, it is preferable that a curable binder component is contained in the color resin composition for color filters of the present invention. The curable binder component is not particularly limited, and conventionally-known curable binder components that are used to form color layers of color filters can be appropriately used.

The curable binder component includes a photocurable binder component containing a photocurable resin, the resin being polymerizable and curable by visible light, ultraviolet or electron beam radiation, etc., and a thermosetting binder component containing a thermosetting resin, the resin being polymerizable and curable by heating.

No developing properties are required of the curable binder component when it is possible to form color layers by attaching the color resin composition of the present invention selectively in a pattern onto a substrate, such as the ink-jet method. In this case, there may be used a known thermosetting binder component or photocurable binder component, appropriately, which are used to form color layers of color filters by the ink-jet method, etc.

On the other hand, in the case of using a photolithography process to form color filters, a photosensitive binder component with alkali developing properties is suitably used.

Hereinafter, the photosensitive binder component and the thermosetting binder component which is suitable for use in the ink jet method, will be explained in detail. However, the curable binder component used in the present invention is not limited to them.

(1) Photosensitive Binder Component

Photosensitive binder components include a positive photosensitive binder component and a negative photosensitive binder component. Examples of positive photosensitive binder components include those containing an alkali soluble resin and an o-quinonediazide group-containing compound, which is a photosensitivity-imparting component. Examples of alkali soluble resins include polyimide precursors.

As the negative photosensitive binder component, those containing at least an alkali soluble resin, a polyfunctional monomer and a photoinitiator, are suitably used. Hereinafter, the alkali soluble resin, the polyfunctional monomer and the photoinitiator will be explained in detail.

<Alkali Soluble Resin>

The alkali soluble resin preferred in the present invention is a resin having a carboxyl group. Concrete examples thereof include acrylic copolymers having a carboxyl group and epoxy (meth)acrylate resins having a carboxyl group. Of these, particularly preferred is one having a carboxyl group and, moreover, a photopolymerizable functional group such as an ethylenically unsaturated group in a side chain thereof. This is because there is an increase in the hardness of the cured film thus formed, by containing the photopolymerizable functional group. These acrylic copolymers and epoxy (meth)acrylate resins can be used in combination of two or more kinds.

An acrylic copolymer having a carboxyl group is obtained by copolymerizing a carboxyl group-containing ethylenically unsaturated monomer and an ethylenically unsaturated monomer.

The acrylic copolymer having a carboxyl group can further contain a constitutional unit having an aromatic carbon ring. The aromatic carbon ring functions as a component which imparts coatability to the color resin composition for color filters.

The acrylic copolymer having a carboxyl group can further contain a constitutional unit having an ester group. The constitutional unit having an ester group not only functions as a component which inhibits alkali solubility of the color resin composition for color filters, but also functions as a component which increases solubility in solvents and re-solubility in solvents.

Examples of the acrylic copolymer having a carboxyl group include copolymers obtained from one or more kinds selected from the group consisting of: methyl (meth)acrylate, ethyl (meth)acrylate, n-propyl (meth)acrylate, isopropyl (meth)acrylate, n-butyl (meth)acrylate, sec-butyl (meth) acrylate, isobutyl (meth)acrylate, tert-butyl (meth)acrylate, n-hexyl (meth)acrylate, 2-ethylhexyl (meth)acrylate, n-octyl (meth)acrylate, benzyl (meth)acrylate, phenyl (meth)acrylate, phenoxyethyl (meth)acrylate, cyclohexyl (meth)acrylate, isobornyl (meth)acrylate, dicyclopentanyl (meth)acrylate, 1-adamantyl (meth)acrylate, allyl (meth)acrylate, 2,2'-oxybis(methylene)bis-2-propenoate, styrene, γ-methylstyrene, glycidyl (meth)acrylate, 2-hydroxyethyl (meth)acrylate, 2-dimethylaminoethyl (meth)acrylate, N-vinyl-2-pyrrolidone, N-methylmaleimide, N-cyclohexylmaleimide, N-benzylmaleimide and N-phenylmaleimide; with one or more anhydrides selected from the group consisting of: (meth)acrylic acid, 2-(meth)acryloyloxyethyl succinic acid, 2-(meth)acryloyloxyethyl phthalic acid, acrylic acid dimer (e.g., M-5600 manufactured by TOAGOSEI Co., Ltd.), itaconic acid, crotonic acid, maleic acid, fumaric acid and vinyl acetic acid. Also, there may be mentioned polymers obtained by introducing an ethylenically unsaturated bond in the above copolymers by, for example, addition of an ethylenically unsaturated compound having a reactive functional group such as a glycidyl group or hydroxyl group. In the present invention, however, the acrylic copolymer having a carboxyl group is not limited to these examples.

Of these examples, the polymers obtained by introducing an ethylenically unsaturated bond in the above copolymers by, for example, addition of an ethylenically unsaturated compound having a glycidyl group or hydroxyl group, are particularly preferred from the point of view that polymerization with the below-described polyfunctional monomer is possible upon exposure and stable color filters can be obtained.

The copolymerization ratio of the carboxyl group-containing ethylenically unsaturated monomer in the carboxyl group-containing copolymer is generally 5 to 50% by mass, preferably 10 to 40% by mass. When the copolymerization ratio of the carboxyl group-containing ethylenically unsaturated monomer is less than 5% by mass, there is a decrease in the solubility of the coating film thus obtained in alkali developing solutions, resulting in a difficulty with pattern formation. When the copolymerization ratio exceeds 50% by mass, upon development with an alkali developing solution, a pattern thus formed is likely to come off of the substrate or roughening of pattern surface is likely to occur.

The molecular weight of the carboxyl group-containing copolymer is preferably in a range of 1,000 to 500,000, more preferably in a range of 3,000 to 200,000. When the molecular weight is less than 1,000, there may be a remarkable decrease in binder function after curing. When the molecular weight exceeds 500,000, upon development with an alkali developing solution, pattern formation may be difficult.

The epoxy (meth)acrylate resin having a carboxyl group is not particularly limited. As the resin, however, an epoxy (meth)acrylate compound obtained by reaction of an acid anhydride with a reaction product of an epoxy compound and an unsaturated group-containing monocarboxylic acid, is suitable.

The epoxy compound is not particularly limited. Examples thereof include epoxy compounds such as bisphenol A type epoxy compounds, bisphenol F type epoxy compounds, bisphenol S type epoxy compounds, phenol novolac type epoxy compounds, cresol novolac type epoxy compounds, aliphatic epoxy compounds and bisphenol fluorene type epoxy compounds. They can be used alone or in combination of two or more kinds.

As the unsaturated group-containing monocarboxylic acid, for example, there may be mentioned (meth)acrylic acid, 2-(meth)acryloyloxyethyl succinic acid, 2-(meth)acryloyloxyethyl phthalic acid, (meth)acryloyloxyethyl hexahydrophthalic acid, (meth)acrylic acid dimer, β-furfuryl acrylic acid, β-styryl acrylic acid, cinnamic acid and α-cyano cinnamic acid. These unsaturated group-containing monocarboxylic acids can be used alone or in combination of two or more kinds.

As the acid anhydride, there may be mentioned the following: dibasic acid anhydrides such as maleic anhydride, succinic anhydride, itaconic anhydride, phthalic anhydride, tetrahydrophthalic anhydride, hexahydrophthalic anhydride, methylhexahydrophthalic anhydride, endomethylene tetrahydrophthalic anhydride, methylendomethylene tetrahydrophthalic anhydride, chlorendic anhydride, methyltetrahydrophthalic anhydride; aromatic polycarboxylic acid anhydrides such as trimellitic anhydride, pyromellitic dianhydride, benzophenonetetracarboxylic dianhydride, biphenyltetracarboxylic dianhydride, biphenyl ether tetracarboxylic acid; and polycarboxylic acid anhydride derivatives such as 5-(2,5-dioxotetrahydrofuryl)-3-methyl-3-cyclohexene-1,2-dicarboxylic anhydride and endobicyclo-[2,2,1]-hepto-5-ene-2,3-dicarboxylic anhydride. They can be used alone or in combination of two or more kinds.

The molecular weight of the carboxyl group-containing epoxy (meth)acrylate compound obtained as above, is not particularly limited. However, it is preferably 1,000 to 40,000 more preferably 2,000 to 5,000.

The alkali soluble resin used in the color resin composition for color filters of the present invention, can be used one alkali soluble resin or a combination of two or more alkali soluble resins. The content of the alkali soluble resin is generally in a range of 10 to 1,000 parts by mass, preferably in a range of 20 to 500 parts by mass, with respect to 100 parts by mass of the color material contained in the color resin composition for color filters. When the content of the alkali soluble resin is too small, sufficient alkali developing properties may be obtained. When the content is too large, the ratio of the color material is relatively small, so that sufficient color concentration may not be obtained.

<Polyfunctional Monomer>

The polyfunctional monomer used in the color resin composition for color filters of the present invention, is not particularly limited, as long as it is polymerizable with the below-described photoinitiator. As the polyfunctional monomer, a compound having two or more ethylenically unsaturated double bonds is generally used. Preferably, the polyfunctional monomer is a polyfunctional (meth)acrylate having two or more acryloyl or methacryloyl groups.

Example of such a polyfunctional (meth)acrylate include difunctional (meth)acrylates such as ethylene glycol di(meth)acrylate, diethylene glycol di(meth)acrylate, hexanediol di(meth)acrylate, long chain aliphatic di(meth)acrylate, neopentyl glycol di(meth)acrylate, hydroxypivalic acid neopentylglycol di(meth)acrylate, stearic acid-modified pentaerythritol di(meth)acrylate, propylene glycol di(meth)acrylate, glycerol di(meth)acrylate, triethylene glycol di(meth)acrylate, tetraethylene glycol di(meth)acrylate, butylene glycol di(meth)acrylate, dicyclopentanyl di(meth)acrylate, polyethylene glycol di(meth)acrylate, polypropylene di(meth)acrylate, triglycerol di(meth)acrylate, neopentyl glycol-modified trimethylolpropane di(meth)acrylate, allylcyclohexyl di(meth)acrylate, methoxycyclohexyl di(meth)acrylate, acrylated isocyanurate, bis(acryloxy neopentyl glycol)adipate, bisphenol A di(meth)acrylate, tetrabromo bisphenol A di(meth)acrylate, bisphenol S di(meth)acrylate, butanediol di(meth)acrylate, phthalic di(meth)acrylate, phosphate di(meth)acrylate, zinc di(meth)acrylate.

Examples of trifunctional polyfunctional (meth)acrylates include trimethylolpropane tri(meth)acrylate, trimethylol ethane tri(meth)acrylate, glycerol tri(meth)acrylate, pentaerythritol tri(meth)acrylate, pentaerythritol tetra(meth)acrylate, alkyl-modified dipentaerythritol tri(meth)acrylate, succinic anhydride-modified pentaerythritol tetra(meth)acrylate, phosphate tri(meth)acrylate, tris(acryloxyethyl)isocyanurate, tris(methacryloxyethyl)isocyanurate, dipentaerythritol tetra(meth)acrylate, ditrimethylolpropane tetraacrylate, alkyl-modified dipentaerythritol tetra(meth)acrylate, dipentaerythritol hexa(meth)acrylate, dipentaerythritol penta(meth)acrylate, alkyl-modified dipentaerythritol penta(meth)acrylate, succinic anhydride-modified dipentaerythritol penta(meth)acrylate, urethane tri(meth)acrylate, urethane hexa(meth)acrylate and ester hexa(meth)acrylate.

These polyfunctional (meth)acrylates can be used alone or in combination of two or more kinds. When excellent photocurability (high sensitivity) is required of the color resin composition for color filters of the present invention, the polyfunctional monomer is preferably one having three or more polymerizable double bonds (trifunctional). Preferred are poly(meth)acrylates of trivalent or higher polyalcohols and dicarboxylic acid-modified products thereof. Concrete examples thereof include succinic acid-modified products of trimethylolpropane tri(meth)acrylate, pentaerythritol tri(meth)acrylate and pentaerythritol tri(meth)acrylate, succinic acid-modified products of pentaerythritol tetra(meth)acrylate, dipentaerythritol tetra(meth)acrylate, dipentaerythritol penta(meth)acrylate and dipentaerythritol penta(meth)acrylate, and dipentaerythritol hexa(meth)acrylate.

The content of the polyfunctional monomer used in the color resin composition for color filters of the present invention, is not particularly limited. However, it is generally about 5 to 500 parts by mass, preferably in a range of 20 to 300 parts by mass, with respect to 100 parts by mass of the alkali-soluble resin. When the content of the polyfunctional monomer is smaller than the range, photocuring may not proceed sufficiently and the color resin composition exposed to light may be melted. When the content of the polyfunctional monomer is larger than the range, there may be a decrease in alkali developing properties.

<Photoinitiator>

The photoinitiator used in the color resin composition for color filters of the present invention, is not particularly limited and can be appropriately selected from various kinds of conventionally-known photoinitiators. Examples thereof include aromatic ketones such as benzophenone, Michler's ketone, 4,4'-bisdiethylaminobenzophenone, 4-methoxy-4'-dimethylaminobenzophenone, 2-ethylanthraquinone and phenanthrene; benzoin ethers such as benzoin methyl ether, benzoin ethyl ether and benzoin phenyl ether; benzoins such as methylbenzoin and ethylbenzoin; 2-(o-chlorophenyl)-4,5-phenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2,4,5-triarylimidazole dimer, 2-(o-chlorophenyl)-4,5-di(m-methylphenyl)imidazole dimer; 2-benzyl-2-dimethylamino-1-(4-morpholinophenyl)-butanone; halomethyl oxadiazole compounds such as 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole; halomethyl-S-triazine compounds such as 2,4-bis(trichloromethyl)-6-p-methoxystyryl-S-triazine, 2,4-bis(trichloromethyl)-6-(1-p-dimethylaminophenyl 1,3-butadienyl)-S-triazine, 2-trichloromethyl-4-amino-6-p-methoxystyryl-S-triazine, 2-(naphtho-1-yl)-4,6-bis-trichloromethyl-S-triazine, 2-(4-ethoxy-naphtho-1-yl)-4,6-bis-trichloromethyl-S-triazine, and 2-(4-butoxy-naphtho-1-yl)-4,6-bis-trichloromethyl-S-triazine; and others such as 2,2-dimethoxy-1,2-diphenylethane-1-on, 2-methyl-1-[4-(methylthio)phenyl]-2-morpholinopropanone, 1,2-benzyl-2-dimethylamino-1-(4-morpholinophenyl)-butanone-1,1-hydroxy-cyclohexyl-phenylketone, benzyl, benzoylbenzoic acid, methyl benzoylbenzoate, 4-benzoyl-4'-methyl diphenyl sulfide, benzil methyl ketal, dimethyl amino benzoate, p-isoamyl dimethylaminobenzoate, 2-n-butoxyethyl-4-dimethyl amino benzoate, 2-chlorothioxanthone, 2,4-diethylthioxanthone, 2,4-dimethylthioxanthone, isopropylthioxanthone, ethanone, 1-[9-ethyl-6-(2-methylbenzoyl)-9H-carbazole-3-yl]-1-(o-acetyloxime), 4-benzoyl-methyl diphenyl sulfide, 1-hydroxy-cyclohexyl-phenylketone, 2-benzyl-2-(dimethylamino)-1-[4-(4-morpholinyl)phenyl]-1-butanone, 2-(dimethylamino)-2-[(4-methylphenyl)methyl]-1-[4-(4-morpholinyl)phenyl]-1-butanone, n-dimethoxy-α-phenylacetophenone, phenylbis(2,4,6-trimethylbenzoyl)phosphine oxide, and 2-methyl-1-[4-(methylthio)phenyl]-2-(4-morpholinyl)-1-propanone. These photoinitiators can be used alone or in combination of two or more kinds.

The content of the photoinitiator used in the color resin composition for color filters of the present invention, is generally about 0.01 to 100 parts by mass, preferably 5 to 60 parts by mass, with respect to 100 parts by mass of the polyfunctional monomer. When the content is smaller than the range, sufficient polymerization reaction may not be caused, so that the hardness of color layers may not be sufficient. When the content is larger than the range, the content of the color material and so on in the solid of the color resin composition for color filters is relatively small, so that sufficient color concentration may not be obtained.

(2) Thermosetting Binder Component

As the thermosetting binder component, a combination of a curing agent and a compound having two or more thermosetting functional groups per molecule is generally used. In addition, a catalyst which can promote thermosetting reaction can be added. As each of the thermosetting functional groups, there may be mentioned an epoxy group, oxetanyl group, isocyanate group, ethylenically unsaturated bond, etc. As each of the thermosetting functional groups, an epoxy group is preferably used. In addition, a polymer having no polymerization ability can be further used.

As the compound having two or more thermosetting functional groups per molecule, an epoxy compound having two or more epoxy groups per molecule is preferably used. The epoxy compound having two or more epoxy groups per molecule is an epoxy compound having two or more epoxy groups, preferably 2 to epoxy groups, more preferably 2 to 20 epoxy groups, per molecule (including those referred to as epoxy resins). The epoxy groups are only required to have an oxirane ring structure, and there may be mentioned glycidyl groups, oxyethylene groups and epoxycyclohexyl groups, for example. As the epoxy compound, there may be mentioned conventionally-known polyvalent epoxy compounds curable by carboxylic acid. Such epoxy compounds are widely disclosed in references such as "The epoxy resin handbook" (edited by Masaki Jinbo, published by Nikkan Kogyo Shimbun Ltd. (1987)) and they can be used as the epoxy compound.

i) Compound Having Two or More Thermosetting Functional Groups Per Molecule

As the epoxy compound which has a relatively high molecular weight and is generally used as a curable binder component (hereinafter may be referred to as "binder type epoxy compound"), there may be used a polymer which contains at least a constitutional unit represented by the following general formula (X) and a constitutional unit represented by the following general formula (XI) and which has two or more glycidyl groups:

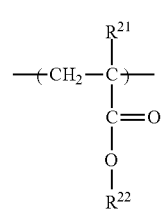

General Formula (X)

wherein $R^{21}$ is a hydrogen atom or an alkyl group having 1 to 3 carbon atoms, and $R^{22}$ is a hydrocarbon group having 1 to 12 carbon atoms; and

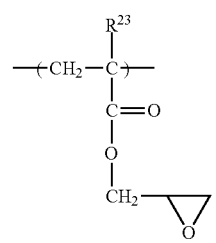

General Formula (XI)

wherein $R^{23}$ is a hydrogen atom or an alkyl group having 1 to 10 carbon atoms.

By using the constitutional unit represented by the formula (X) as a constitutional unit of the binder type epoxy compound, sufficient hardness and transparency can be provided to the cured coating film formed from the resin composition of the present invention. In the formula (X), $R^{21}$ is preferably a hydrogen or methyl group; $R^{22}$ is a hydrocarbon group having 1 to 12 carbon atoms, which can be any one of a straight-chain aliphatic hydrocarbon group, an alicyclic hydrocarbon group and an aromatic hydrocarbon group, and which also can contain an additional structure such as double bond, a side chain of a hydrocarbon group, a side chain of a spiro ring, an endocyclic cross-linked hydrocarbon group, etc.

Concrete examples of monomers which can derive the constitutional unit represented by the formula (X) include methyl (meth)acrylate, ethyl (meth)acrylate, i-propyl (meth)acrylate, n-propyl (meth)acrylate, i-butyl (meth)acrylate, n-butyl (meth)acrylate, t-butyl (meth)acrylate, 2-ethylhexyl (meth)acrylate, hexyl (meth)acrylate, octyl (meth)acrylate, lauryl (meth)acrylate, cyclohexyl (meth)acrylate, para-t-butyl cyclohexyl (meth)acrylate, isobornyl (meth)acrylate, benzyl (meth)acrylate, dicyclopentenyl (meth)acrylate and phenyl (meth)acrylate.

The constitutional unit represented by the formula (XI) is used to introduce an epoxy group (epoxy reaction site) in the polymer. The resin composition containing the polymer has excellent storage stability and is unlikely to cause viscosity increase during storage and ejection. One of the reasons is estimated to be that the epoxy group in the formula (XI) is a glycidyl group.

In the formula (XI), $R^{23}$ is preferably a hydrogen or methyl group. Concrete examples of monomers which can derive the constitutional unit represented by the formula (XI) include glycidyl (meth)acrylate, and particularly preferred is glycidyl methacrylate (GMA).

The polymer can be a random copolymer or block copolymer. Also, the polymer can contain a main chain constitutional unit other than the formula (X) or (XI) as long as the properties required of the fine portions of a color filter can be ensured, such as hardness and transparency. Concrete examples of such monomers include acrylonitrile and styrene.

The content ratio between the constitutional units represented by the formula (X) and the constitutional units represented by the formula (XI) in the binder type epoxy compound is preferably in a range of 10:90 to 90:10. When the amount of the constitutional units represented by the formula (X) exceeds the ratio 90:10, curing reaction sites decrease and may result in a decrease in cross-linking density. On the other hand, when the amount of the constitutional units represented by the formula (XI) exceeds the ratio 10:90, bulky skeletons decrease and may result in an increase in curing shrinkage.

The mass average molecular weight of the binder type epoxy compound is preferably 3,000 or more, particularly preferably 4,000 or more, in terms of polystyrene-equivalent mass average molecular weight. This is because the physical properties required of the cured layer used as one of the fine portions of a color filter, such as hardness and solvent resistance, are likely to be poor when the molecular weight of the binder type epoxy compound is smaller than 3,000. On the other hand, the mass average molecular weight of the binder type epoxy compound is preferably 20,000 or less, particularly preferably 15,000 or less, in terms of polystyrene-equivalent mass average molecular weight. This is because when the molecular weight is larger than 20,000, viscosity increase is likely to occur and may result in poor sustainability of discharge rate of the ink ejected from an ink-jet head or on the straightness of drop direction, or may result in poor long-term storage stability of ink. The binder type epoxy compound can be synthesized by the method as disclosed in paragraph 0148 of Japanese Patent Application Laid-Open (JP-A) No. 2006-106503, for example.

As the thermosetting binder, there may be used an epoxy compound having two or more epoxy groups per molecule (hereinafter may be referred to as "polyfunctional epoxy compound") and a molecular weight smaller than the binder type epoxy compound. It is particularly preferable to use a combination of the binder type epoxy compound and the polyfunctional epoxy compound, as mentioned above. In this case, the polystyrene-equivalent mass average molecular weight of the polyfunctional epoxy compound is preferably 4,000 or less, particularly preferably 3,000 or less, based on the condition that the polystyrene-equivalent mass average molecular weight is smaller than that of the binder type epoxy compound to be combined therewith. When a polyfunctional epoxy compound having a relatively small molecular weight is mixed with the resin composition, epoxy groups are added to the resin composition, so that there is an increase in the concentration of epoxy reaction sites and thus an increase in cross-linking density.

Of polyfunctional epoxy compounds, it is preferably to use an epoxy compound having four or more epoxy groups per molecule, in order to increase cross-linking density resulted from acid-epoxy reaction. Especially in the case where the mass average molecular weight of the binder type epoxy compound is, in order to increase ejecting performance from an ink-jet head, 10,000 or less, the strength and hardness of the cured layer are likely to decrease. Therefore, it is preferable to add such a tetrafunctional or more polyfunctional epoxy compound to the resin composition to sufficiently increase the cross-linking density.

The polyfunctional epoxy compound is not particularly limited, as long as it has two or more epoxy groups per molecule. For example, there may be used bisphenol A type epoxy resin, bisphenol F type epoxy resin, brominated bisphenol A type epoxy resin, bisphenol S type epoxy resin, diphenyl ether type epoxy resin, hydroquinone type epoxy resin, naphthalene type epoxy resin, biphenyl type epoxy resin, fluorene type epoxy resin, phenol novolac type epoxy resin, orthocresol novolac type epoxy resin, trishydroxyphenylmethane type epoxy resin, trifunctional type epoxy resin, tetraphenylolethane type epoxy resin, dicyclopentadiene phenol type epoxy resin, hydrogenated bisphenol A type epoxy resin, polyol-containing bisphenol A type epoxy resin, polypropylene glycol type epoxy resin, glycidyl ester type epoxy resin, glycidyl amine type epoxy resin, glyoxal type epoxy resin, alicyclic epoxy resin and heterocyclic epoxy resin.

The content of the binder type epoxy compound and that of the polyfunctional epoxy compound, which is added as needed, are as follows, in terms of mass ratio. Preferably, the binder type epoxy compound is 10 to 80 parts by mass and the polyfunctional epoxy compound is 10 to 60 parts by mass. More preferably, the binder type epoxy compound is 20 to 60 parts by mass and the polyfunctional epoxy compound is 20 to 50 parts by mass. Particularly preferably, the binder type epoxy compound is 30 to 40 parts by mass and the polyfunctional epoxy compound is 25 to 35 parts by mass.

ii) Curing Agent

The binder component used in the present invention is generally used in combination with a curing agent.

As the curing agent used, for example, polycarboxylic acid anhydride or polycarboxylic acid is used. Concrete examples of polycarboxylic acid anhydride include aliphatic or alicyclic dicarboxylic anhydride such as phthalic anhydride, itaconic anhydride, succinic anhydride, citraconic anhydride, dodecenyl succinic anhydride, tricarballylic anhydride, maleic anhydride, hexahydrophthalic anhydride, dimethyltetrahydrophthalic anhydride, himic anhydride and nadic anhydride; aliphatic polycarboxylic acid dianhydride such as 1,2,3,4-butanetetracarboxylic dianhydride and cyclopentanetetracarboxylic dianhydride; aromatic polycarboxylic acid anhydride such as pyromellitic dianhydride, trimellitic anhydride and benzophenonetetracarboxylic anhydride; and ester group-containing acid anhydride such as ethylene glycol bistrimellitate anhydride and glycerin tristrimellitate anhydride. Particularly preferred is aromatic polycarboxylic acid anhydride. Also, epoxy resin curing agents containing commercially-available carboxylic anhydride are suitably used.

Concrete examples of the polycarboxylic acid used in the present invention include aliphatic polycarboxylic acid such as succinic acid, glutaric acid, adipic acid, butanetetracarboxylic acid, maleic acid and itaconic acid; aliphatic polycarboxylic acid such as hexahydrophthalic acid, 1,2-cyclohexanedicarboxylic acid, 1,2,4-cyclohexanetricarboxylic acid and cyclopentanetetracarboxylic acid; and aromatic polycarboxylic acid such as phthalic acid, isophthalic acid, terephthalic acid, pyromellitic acid, trimellitic acid, 1,4,5,8-naphthalenetetracarboxylic acid and benzophenonetetracarboxylic acid. Preferred is aromatic polycarboxylic acid.

These curing agents can be used alone or in combination of two or more kinds. The amount of the curing agent used in the present invention is generally in a range of 1 to 100 parts by mass, preferably 5 to 50 parts by mass, with respect to 100 parts by mass of the epoxy group-containing component (the total amount of the binder type epoxy compound and the polyfunctional epoxy compound). When the amount of the curing agent is less than 1 part by mass, curing is insufficient and may result in a failure to produce a tough coating film. When the amount of the curing agent exceeds 100 parts by mass, the adhesion properties of the coating film to the substrate may be poor.

iii) Catalyst

To increase the hardness and heat resistance of the cured film, a catalyst can be added to the binder component used in the present invention, which can promote thermosetting reaction between acid and epoxy. As such a catalyst, there may be used a thermal potential catalyst which shows activity upon heat-curing.

A thermal potential catalyst is a catalyst which shows catalytic activity, promotes curing reaction and provides excellent physical properties to the thus-obtained cured product when heated, and which is added as needed. In the present invention, the thermal potential catalyst is preferably one which shows acid catalytic activity at a temperature of 60° C. or more. Examples thereof include a compound obtained by neutralizing protonic acid with Lewis base, a compound obtained by neutralizing Lewis acid with Lewis base, a mixture of Lewis acid and trialkyl phosphate, sulfonic esters and onium compounds. There may be used various kinds of compounds as disclosed in JP-A No. H04-218561. In general, the thermal potential catalyst is used in an amount of about 0.01 to 10.0 parts by mass, with respect to the total of the curing agent and the compound having two or more thermosetting functional groups per molecule, that is, 100 parts by mass of the agent and compound.

(Optionally-Added Compounds)

As needed, the color resin composition for color filters of the present invention can further contain a pigment or various kinds of additives, as long as there is no deterioration in the object of the present invention.

(Pigment)

The pigment is added in order to control color tone. It can be selected from conventionally-known pigments, according to the purpose, and such pigments can be used alone or in combination of two or more kinds.

As the pigment, for example, there may be mentioned C.I. pigment violet 1, C.I. pigment violet 2, C.I. pigment violet 19, C.I. pigment violet 23, C.I. pigment violet 29, C.I. pigment violet 32, C.I. pigment violet 36, C.I. pigment violet 38, C.I. pigment red 81, C.I. pigment blue 15, C.I. pigment blue 15:3, C.I. pigment blue 15:4, C.I. pigment blue 15:6 and C.I. pigment blue 60, for example.

The content of the pigment is not particularly limited, as long as the effects of the present invention are not undermined. For example, the content of the pigment is as follows: the mass ratio between the color material represented by the general formula (I) and the pigment is preferably 9.9:0.1 to 5:5, more preferably 9.5:0.5 to 6:4, particularly preferably 9.5:0.5 to 7:3. This is because when the pigment content is in this range, color tone can be controlled without undermining the high transmittance exerted by the color material represented by the general formula (I).

(Additives)

Examples of additives include a polymerization terminator, a chain transfer agent, a leveling agent, a plasticizer, a surfactant, a defoaming agent, a silane coupling agent, an ultraviolet absorber and an adhesion enhancing agent.

Examples of surfactants that can be used in the present invention include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, fatty acid-modified polyesters and tertiary amine-modified polyurethanes. Also, there may be used a fluorine-containing surfactant.

Examples of plasticizers include dibutyl phthalate, dioctyl phthalate and tricresyl phosphate. As the defoaming agent and leveling agent, there may be mentioned silicon-containing, fluorine-containing, and acrylic-type compounds, for example.

(The Content of Each Component in the Color Resin Composition for Color Filters)

The total content of the color material represented by the general formula (I) and the pigment added as needed (hereinafter, they may be referred to as "color material and so on") is preferably 5 to 65% by mass, more preferably 8 to 55% by mass, with respect to the total solid content of the color resin composition for color filters. When the content of the color material and so on is small, insufficient color concentration may be provided to the layer obtained by applying the color resin composition for color filters to achieve a predetermined thickness (generally 1.0 to 5.0 μm). When the content of the color material and so on is large, insufficient layer properties may be provided to the layer obtained by applying the color resin composition to a substrate and curing the same, such as adhesion properties to the substrate, surface roughness and hardness of the layer. In addition, properties such as solvent resistance may be insufficient since the content ratio of the dispersant used for dispersion of the color material and so on in the color resin composition for color filters, is also large. In the present invention, "solid content" includes all the above-described components other than the solvent, and it also includes the polyfunctional monomer and the like dissolved in the solvent.

Also, the content of the dispersant is not particularly limited, as long as it is able to homogeneously disperse the color material and so on. For example, the dispersant content is 10 to 150 parts by mass, with respect to 100 parts by mass of the color material and so on. More preferably, the content is 15 to 45 parts by mass, particularly preferably 15 to 40 parts by mass, with respect to 100 parts by mass of the color material and so on. The total content of the dispersant is preferably in a range of 1 to 60% by mass, particularly preferably 5 to 50% by mass, with respect to the total solid content of the color resin composition for color filters. When the content is less than 1% by mass, it may be difficult to homogeneously disperse the color material and so on. When the content exceeds 60% by mass, there may be a decrease in curing and developing properties.

The total amount of the binder component is 24 to 94% by mass, preferably 40 to 90% by mass, with respect to the total solid content of the color resin composition for color filters.

The content of the solvent is not particularly limited, as long as a color layer can be formed with accuracy. In general, the content is preferably in a range of 65 to 95% by mass, particularly preferably in a range of 75 to 88% by mass, with respect to the total amount of the color resin composition for color filters, including the solvent. When the content of the solvent is in the range, excellent coatability can be provided to the color resin composition.

(Production of the Color Resin Composition for Color Filters)

As the method for producing the color resin composition for color filters, for example, there may be mentioned (1) a method in which the above-described color material dispersion liquid of the present invention, the binder component and various additives used as needed, are added to the solvent at the same time and mixed, and (2) a method in which the binder component and various additives used as needed are added to the solvent and mixed; thereafter, the color material dispersion liquid of the present invention is added to the mixture and mixed.

Next, the color filter of the present invention will be explained.

[Color Filter]

The color filter of the present invention contains at least a transparent substrate and color layers disposed on the substrate, wherein at least one of the color layers is a color layer which is a cured product of the color resin composition for color filters of the present invention.

Such a color filter of the present invention will be explained, with reference to figures. FIG. 1 is a schematic cross-sectional view showing an example of the color filter of the present invention. FIG. 1 shows that a color filter 10 of the present invention contains transparent substrate 1, a light shielding part 2 and a color layer 3.

(Color Layer)

The color layer used in the color filter of the present invention is not particularly limited, as long as it is a cured product of the above-described color resin composition for color filters of the present invention. However, it is generally formed on an opening of the light shielding part on the below-described transparent substrate and generally composed of color patterns in three or more colors.

The arrangement of the color layers is not particularly limited and can be a general arrangement such as a stripe type, a mosaic type, a triangle type or a four-pixel arrangement type. The width, area, etc., of the color layer can be determined appropriately.

The thickness of the color layer is appropriately controlled by controlling the applying method, solid content concentration, viscosity, etc., of the color resin composition for color filters. In general, the thickness is preferably in a range of 1 to 5 μm.

For example, when the color resin composition is a photosensitive resin composition, the color layer can be formed by the following method.

First, the above-described color resin composition for color filters of the present invention is applied onto the below-described transparent substrate by a coating method such as a spray coating method, a dip coating method, a bar coating method, a roll coating method or a spin coating method to form a wet coating film.

Then, the wet coating film is dried with a hot plate or oven. The dried film is subjected to exposure through a mask with a given pattern to cause a photopolymerization reaction of the alkali-soluble resin, the polyfunctional monomer, etc., thereby obtaining a coating film of the color resin composition for color filters. Examples of light sources and lights that can be used for the exposure include a low pressure mercury lamp, a high pressure mercury lamp and a metal halide lamp, and ultraviolet rays and electron beams. The exposure amount is appropriately controlled, according to the used light source and the thickness of the coating film.

The film can be heated to promote polymerization reaction after the exposure. The heating condition is appropriately determined, depending on the content ratio of the components used in the color resin composition for color filters of the present invention, the thickness of the coating film, etc.

Next, the thus-obtained film is developed with a developing solution to dissolve and remove unexposed portions, thereby forming a coating film in a desired pattern. As the developing solution, a solution obtained by dissolving alkali in water or aqueous solvent, is generally used. An appropriate amount of surfactant, etc., can be added to the alkali solution. The developing method can be selected from general developing methods.

After the developing treatment, generally, the developing solution is rinsed off, followed by drying of the cured coating film of the color resin composition for color filters, thereby forming a color layer. A heating treatment can be performed after the developing treatment to sufficiently cure the coating film. The heating condition is not particularly limited and appropriately determined depending on the intended use of the coating film.

The color layer can be formed by the following method, in the case of forming the layer by the ink-jet method, for example.

First, color resin compositions for color filters are prepared, each of which containing any one of color materials including blue (B), green (G) and red (R) color materials and at least one of which containing the color resin composition for color filters of the present invention. Then, the thus-prepared color resin compositions for color filters are selectively attached by the ink-jet method to color layer forming regions (regions for forming R, G, B layers) defined by the pattern of the light shielding part on a surface of the transparent substrate 1, thus forming ink layers. In this ink applying process, the color resin compositions for color filters are likely to cause an increase in viscosity at the end of the ink-jet head and are needed to maintain excellent ejection performance. The color resin compositions (R, G, B) can be applied onto the substrate with multiple ink-jet heads, so that they can provide higher work efficiency than the case of forming R, G, B color layers, layer by layer, by the printing method, etc.

Next, the R, G, B color layers are dried, pre-baked (as needed) and then appropriately heated or exposed to light, thereby curing the color layers. When the color layers are appropriately heated or exposed to light, the cross-linking components in the curable resin compositions contained in the color resin compositions for color filters are cross-linked to cure the ink layers, thus forming color layers 3R, 3G, 3B.

(Light Shielding Part)

The light shielding part in the color filter of the present invention is formed in pattern on the below-described transparent substrate and can be those which are used in general color filters.

The pattern shape of the light shielding part is not particularly limited, and examples thereof include a stripe-shaped pattern, a matrix-shaped patter, etc. As the light shielding pattern, for example, there may be mentioned one produced by dispersing or dissolving a black pigment in a binder resin, and thin metal layers of chromium, chromium oxide, etc. When the light shielding part is such a thin metal layer, the layer can be a stack of two layers of one $CrO_x$ layer (x is an arbitrary number) and one Cr layer, or can be a stack of three layers of one $CrO_x$ layer (x is an arbitrary number), one $CrN_y$ layer (y is an arbitrary number) and one Cr layer, the stack of three layers having a further reduced reflectance.

When the light shielding part is one produced by dispersing or dissolving a black colorant in a binder resin, the method for producing the light shielding part is not particularly limited and is only required to be a method which can pattern the light shielding part. For example, there may be mentioned a photolithography method using the color resin composition for color filters for the light shielding part, a printing method using the same, an ink-jet method using the same, etc.

In the case as described above and when using a printing method or ink-jet method to produce the light shielding part, as the binder resin, there may be mentioned polymethyl methacrylate resin, polyacrylate resin, polycarbonate resin, polyvinyl alcohol resin, polyvinylpyrrolidone resin, hydroxylethyl cellulose resin, carboxymethyl cellulose resin, polyvinyl chloride resin, melamine resin, phenol resin, alkyd resin, epoxy resin, polyurethane resin, polyester resin, maleic acid resin or polyamide resin, for example.

In the case as described above and when using a photolithography method to form the light shielding part, as the binder resin, there may be used reactive vinyl group-containing photosensitive resin such as acrylate-based, methacrylate-based, polyvinyl cinnamate-based or cyclized rubber-based photosensitive resin, for example. In this case, a photopolymerization initiator can be added to the color resin composition for forming the light shielding part, the composition containing a black colorant and a photosensitive resin. In addition, a sensitizer, a coatability improving agent, a development modifier, a cross-linking agent, a polymerization inhibitor, a plasticizer, a flame retardant, etc., can be added thereto.

When the light shielding part is a thin metal layer, the method of forming such a light shielding part is not particularly limited, as long as the method allows patterning of the light shielding part. The examples include a photolithography method, a deposition method using a mask, and a printing method, for example.

When the light shielding part is a thin metal layer, the thickness is about 0.2 to 0.4 μm. When the light shielding part is formed from the black colorant dispersed or dissolved in the binder resin, the thickness is about 0.5 to 2 μm.

(Transparent Substrate)

The transparent substrate of the color filter of the present invention is not particularly limited, as long as it is a substrate transparent to visible light. It can be selected from general transparent substrates used in color filters. Concrete examples thereof include inflexible, transparent rigid materials such as silica glass plate, non-alkali glass plate and synthetic silica plate, and transparent, flexible materials such as transparent resin film and optical resin plates.

The thickness of the transparent substrate is not particularly limited. However, depending on the intended use of the color filter of the present invention, one having a thickness of about 100 μm to 1 mm can be used, for example.

In addition to the transparent substrate, the light shielding part and the color layer, the color filter of the present invention can also contain an overcoat layer and a transparent electrode layer, for example. Moreover, an orientation layer and a columnar spacer can be formed in the coating layer.

Next, the liquid crystal display device of the present invention will be explained.

[Liquid Crystal Display Device]

The liquid crystal display device of the present invention contains the above-described color filter of the present invention, a counter substrate, and a liquid crystal layer present between the color filter and the counter substrate.

Figure 2:
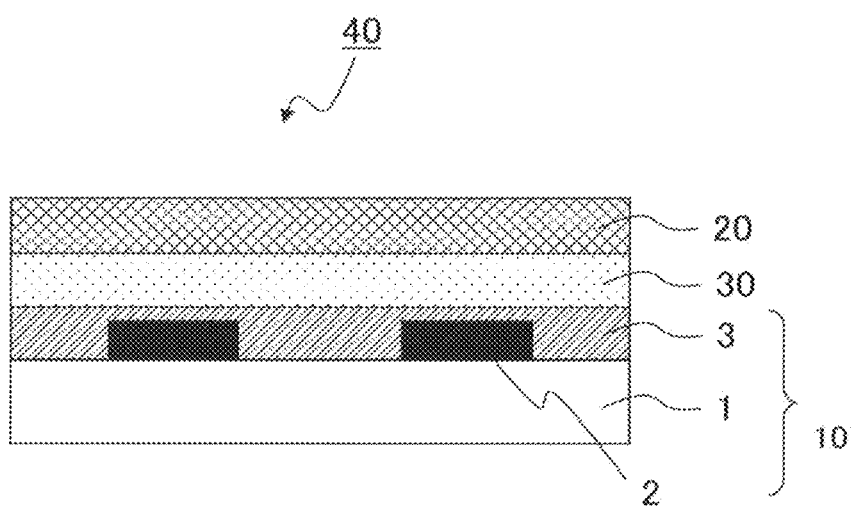
FIG. 2 is a schematic view showing an example of the liquid crystal display device of the present invention.

Such a liquid crystal display device of the present invention will be explained with reference to figures. FIG. 2 is a schematic view showing an example of the liquid crystal display device of the present invention. As shown in FIG. 2, the liquid crystal display device of the present invention, liquid crystal display device 40, contains a color filter 10, a counter substrate 20 containing a TFT array substrate, etc., and a liquid crystal layer 3 formed between the color filter 10 and the counter substrate 20.

The liquid crystal display device of the present invention is not limited to the configuration shown in this FIG. 2. It can be a configuration which is generally known as a liquid crystal display device containing a color filter.

The method for driving the liquid crystal display device of the present invention is not particularly limited and can be selected from driving methods which are generally used in liquid crystal display devises. Examples of such driving methods include a TN method, an IPS method, an OCB method and an MVA method. In the present invention, any of these methods can be suitably used.

The counter substrate can be appropriately selected depending on the driving method, etc., of the liquid crystal display device of the present invention.

Also, the liquid crystal constituting the liquid crystal layer can be selected from various liquid crystals with varying dielectric anisotropies and mixtures thereof, depending on the driving method, etc., of the liquid crystal display device of the present invention.

The method for forming the liquid crystal layer can be selected from methods which are generally used to produce liquid crystal cells. Examples thereof include a vacuum injection method and a liquid crystal dripping method.

In the vacuum injection method, for example, a liquid crystal cell is produced in advance, using a color filter and a counter substrate; liquid crystal is heated to become isotropic liquid; the liquid crystal is injected into the liquid crystal cell, in the form of isotropic liquid, using the capillary effect; the liquid crystal cell is encapsulated with an adhesive agent, thereby forming a liquid crystal layer; then, the encapsulated liquid crystal can be oriented by gradually cooling the liquid crystal cell to room temperature.

In the liquid crystal dripping method, for example, a sealing agent is applied to the to the periphery of the color filter; the color filter is heated to the temperature at which the liquid crystal is in an isotropic phase; the liquid crystal is dripped with a dispenser or the like, in the form of isotropic liquid; the color filter and the counter substrate are stacked under reduced pressure and attached to each other via the applied sealing agent, thereby forming a liquid crystal layer; then, the encapsulated liquid crystal can be oriented by gradually cooling the liquid crystal cell to room temperature.

Next, the organic light-emitting display device of the present invention will be explained.

[Organic Light-Emitting Display Device]

The organic light-emitting display device of the present invention contains the above-described color filter of the present invention and an organic light-emitting material.

Figure 3:
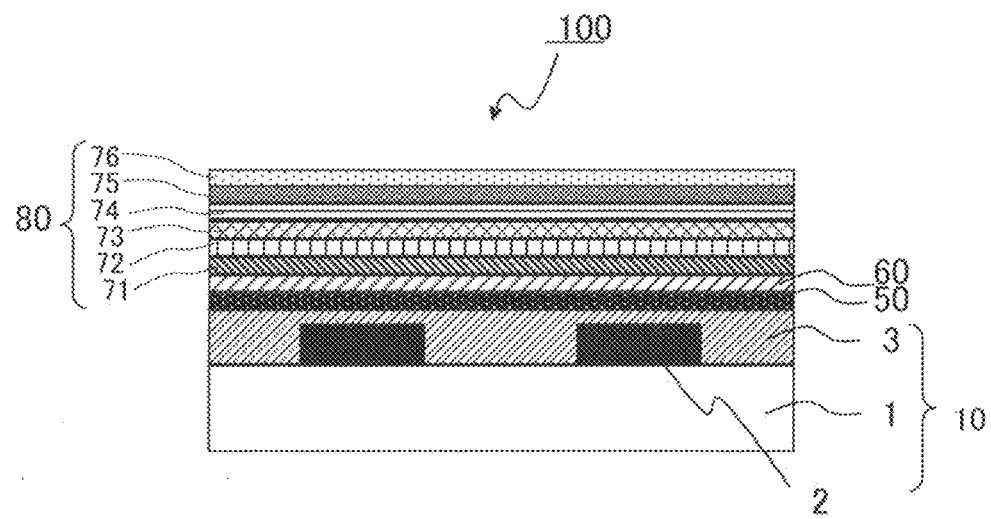
FIG. 3 is a schematic view showing an example of the organic light-emitting display device of the present invention.

Such an organic light-emitting display device of the present invention will be explained with reference to figures. FIG. 3 is a schematic view showing an example of the organic light-emitting display device of the present invention. As shown in FIG. 3, the organic light-emitting display device of the present invention, which is organic light-emitting display device 100, contains a color filter 10 and an organic light-emitting material 80. An organic protection layer 50 and/or an inorganic oxide layer 60 can be present between the color filter 10 and the organic light-emitting material 80.

As the method for stacking the components of the organic light-emitting material 80, for example, there may be mentioned a method of stacking on the color filter a transparent positive electrode 71, a positive hole injection layer 72, a positive hole transport layer 73 a light-emitting layer 74, an electron injection layer 75 and a negative electrode 76 in this sequence, a method of attaching the organic light-emitting material 80 formed on a different substrate onto the inorganic oxide layer 60. In the organic light-emitting material 80, the transparent positive electrode 71, the positive hole injection layer 72, the positive hole transport layer 73, the light-emitting layer 74, the electron injection layer 75, the negative electrode 76 and other components can be selected from conventionally-known materials and used. The organic light-emitting display device 100 produced as above is applicable to passive or active drive organic EL displays, for example.

The organic light-emitting display device of the present invention is not limited to the configuration shown in FIG. 3. It can have any one of configurations which are generally known as those of organic light-emitting display devices containing a color filter.

EXAMPLES

Hereinafter, the present invention will be described in detail, by way of examples and comparative examples. However, the scope of the present invention is not limited to these examples.

Synthesis Example 1

Synthesis of Macromonomer A

First, 80.0 parts by mass of propylene glycol methyl ether acetate (PGMEA) was put in a reactor equipped with a cooling tube, an addition funnel, a nitrogen inlet, a mechanical stirrer and a digital thermometer. While stirring under a nitrogen flow, PGMEA was heated to 90° C. To this PGMEA, a mixed solution of 50.0 parts by mass of methyl methacrylate, 30.0 parts by mass of n-butyl methacrylate, 20.0 parts by mass of benzyl methacrylate, 4.0 parts by mass of mercaptoethanol, 30 parts by mass of PGMEA, and 1.0 part by mass of α,α'-azobisisobutyronitrile (AIBN) was added dropwise for 1.5 hours, and the resultant was further reacted for 3 hours. Next, the nitrogen flow was stopped to cool the reaction solution to 80° C. To the reaction solution, 8.74 parts by mass of Karenz MOI (manufactured by Showa Denko K.K.), 0.125 g of dibutyltin dilaurate, 0.125 part by mass of p-methoxyphenol, and 10 parts by mass of PGMEA were added and stirred for 3 hours, thus obtaining a 49.5% solution of the macromonomer A. The thus-obtained macromonomer A was measured by gel permeation chromatography (GPC) in the condition of N-methylpyrrolidone, 0.01 mol/L lithium bromide-added, and polystyrene standard. As a result, the macromonomer A was found to have a mass average molecular weight (Mw) of 4,010, a number average molecular weight (Mn) of 1,910, and a molecular weight distribution (Mw/Mn) of 2.10. The calculated glass transition temperature (Tg) of the macromonomer A was 64° C.

Synthesis Example 2

Synthesis of Graft Copolymer A

First, 80.0 parts by mass of PGMEA was put in a reactor equipped with a cooling tube, an addition funnel, a nitrogen inlet, a mechanical stirrer and a digital thermometer. While stirring under a nitrogen flow, the mixture was heated to 85° C. To the mixture, a mixed solution of 75.76 parts by mass (active solid content 37.5 parts by mass) of the macromonomer A solution of Synthesis Example 1, 12.5 parts by mass of 2-(dimethylamino)ethyl methacrylate (DMA), 1.24 parts by mass of n-dodecyl mercaptan, 20.0 parts by mass of PGMEA and 0.5 part by mass of AIBN was added dropwise for 1.5 hours and then heated and stirred for 3 hours. Then, to the mixture, a mixed solution of 0.10 parts by mass of AIBN and 10.0 parts by mass of PGMEA was added dropwise for 10 minutes and then further heated at the same temperature for 1 hour, thus obtaining a 25.4% solution of the graft copolymer A. As a result of GPC measurement, the thus-obtained graft copolymer A was found to have a mass average molecular weight (Mw) of 11,480, a number average molecular weight (Mn) of 4,650, a molecular weight distribution (Mw/Mn) of 2.47. The amine value was 89 mgKOH/g.

Production Example 1

Production of Dispersant Solution A

First, 18.4 parts by mass of PGMEA, 30.0 parts by mass of the graft copolymer A solution of Synthesis Example 2 were dissolved in a 225 mL mayonnaise jar. Then, 2.6 parts by mass (0.6 molar equivalent with respect to the amino groups of the graft copolymer) of dimethacryloxyethyl phosphate (product name: Light Ester P-2M; manufactured by Kyoeisha Chemical Co., Ltd.) was added thereto and stirred for 30 minutes at room temperature, thereby producing the dispersant solution A (solid content 20%).

At this time, the amino groups of the graft copolymer formed salts by an acid-base reaction with the phosphate groups of P-2M.

Synthesis Example 3

Synthesis of Intermediate 1

First, 15.2 g (60 mmol) of 1-iodonaphthalene (manufactured by Wako Pure Chemical Industries, Ltd.), 4.63 g (30 mmol) of norbornane diamine (NBDA) (CAS No. 56602-77-8) (manufactured by Mitsui Chemicals, Inc.), 8.07 g (84 mmol) of sodium tert-butoxide, 0.09 g (0.2 mmol) of 2-dicyclohexylphosphino-2',6',-dimethoxybiphenyl (manufactured by Aldrich) and 0.021 g (0.1 mmol) of palladium acetate (manufactured by Wako Pure Chemical Industries, Ltd.) were dispersed in 30 mL of xylene and reacted at 130 to 135° C. for 48 hours. After the reaction, the resultant was cooled to room temperature and water was added thereto. An organic phase was extracted from the resultant and dried with magnesium sulfate and then concentrated, thereby obtaining 8.5 g (yield 70%) of intermediate 1 represented by the following chemical formula (1).

From the following analysis result, the obtained compound was confirmed to be a desired compound.

MS (ESI) (m/z): 407 (M+H)

Values of elemental analysis: CHN actual measurement values (85.47%, 8.02%, 6.72%); theoretical values (85.26%, 8.11%, 6.63%)

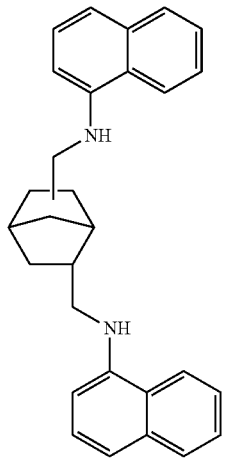

Chemical Formula (1)

Synthesis Example 4

Synthesis of Intermediate 2

First, 8.46 g (20.8 mmol) of the intermediate 1, 13.5 g (41.6 mmol) of 4,4'-bis(dimethylamino)benzophenone (manufactured by Tokyo Chemical Industry Co., Ltd.) and 60 mL of toluene were mixed and agitated at 45 to 50° C. Next, 6.38 g (51.5 mmol) of phosphorus oxychloride (manufactured by Wako Pure Chemical Industries, Ltd.) was added dropwise to the mixture, and the mixture was refluxed for 2 hours and then cooled. After the reaction, the toluene was decanted. A resinous precipitate thus obtained was dissolved by adding 40 mL of chloroform, 40 mL of water and concentrated hydrochloric acid to separate a chloroform phase. The chloroform phase was washed with water and dried with magnesium sulfate and then concentrated. To the thus-obtained concentrated product, 65 mL of ethyl acetate was added and refluxed. After cooling, the thus-produced precipitate was filtered off to obtain 15.9 g (yield 70%) of the intermediate 2 (BB7-Nb-dimer) represented by the following chemical formula (2).

From the following analysis result, the obtained compound was confirmed to be a desired compound.

MS(ESI) (m/z): 511(+), divalent

Values of elemental analysis: CHN actual measurement values (78.13%, 7.48%, 7.78%); theoretical values (78.06%, 7.75%, 7.69%)

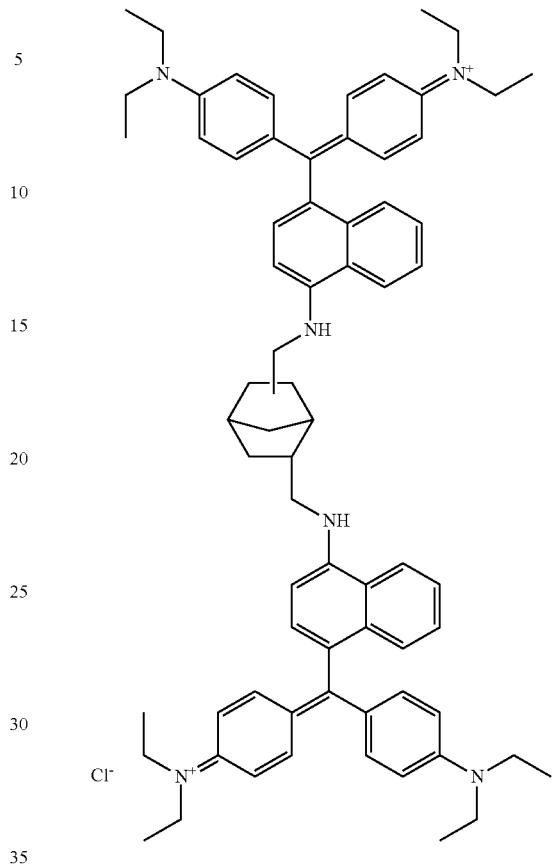

Chemical Formula (2)

Production Example 2

Synthesis of Color Material A

First, 0.433 g (0.18 mmol) of a 12-molybdophosphoric acid n-hydrate of (manufactured by Kanto Chemical Co., Inc., corresponds to 30) and 3.55 g (1.04 mmol) of a 12-tungstophosphoric acid n-hydrate (manufactured by Kanto Chemical Co., Inc., "n" corresponds to 30) were dissolved in 50 mL of water.

To the resultant, 2.0 g (1.83 mmol) of the intermediate 2 dissolved in a mixed solution of 50 mL of water and 100 mL of methanol, was added and agitated for one hour at ordinary temperature. The thus-obtained reaction solution was filtered at reduced pressure, thus obtaining a cake. The cake was washed with water and then dried at reduced pressure, thus obtaining 4.96 g (yield 96%) of the color material A in which molybdenum and tungsten are contained at a molar ratio of 14.6:85.4.

Production Example 3

Synthesis of Color Material B

The color material B in which molybdenum and tungsten are contained at a molar ratio of 9.9:90.0 was obtained in the same manner as Production Example 2, except that the amount used of the 12-molybdophosphoric acid n-hydrate was changed to 0.289 g, and the amount used of the 12-tungstophosphoric acid n-hydrate was changed to 3.76 g.

Production Example 4

Synthesis of Color Material C

The color material C in which molybdenum and tungsten are contained at a molar ratio of 4.7:95.3 was obtained in the same manner as Production Example 2, except that the amount used of the 12-molybdophosphoric acid n-hydrate was changed to 0.144 g, and the amount used of the 12-tungstophosphoric acid n-hydrate was changed to 3.96 g.

Production Example 5

Synthesis of Color Material D

The color material D in which molybdenum and tungsten are contained at a molar ratio of 1.9:98.1 was obtained in the same manner as Production Example 2, except that the amount used of the 12-molybdophosphoric acid n-hydrate was changed to 0.058 g, and the amount used of the 12-tungstophosphoric acid n-hydrate was changed to 4.09 g.

Production Example 6

Synthesis of Color Material E

The color material E in which molybdenum and tungsten are contained at a molar ratio of 1.1:89.8 was obtained in the same manner as Production Example 2, except that the amount used of the 12-molybdophosphoric acid n-hydrate was changed to 0.029 g, and the amount used of the 12-tungstophosphoric acid n-hydrate was changed to 4.13 g.

Production Example 7

Synthesis of Color Material F

The color material F in which molybdenum and tungsten are contained at a molar ratio of 0.4:99.6 was obtained in the same manner as Production Example 2, except that the amount used of the 12-molybdophosphoric acid n-hydrate was changed to 0.014 g, and the amount used of the 12-tungstophosphoric acid n-hydrate was changed to 4.15 g.

Production Example 8

Synthesis of Color Material G

The color material G in which molybdenum is not contained was obtained in the same manner as Production Example 2, except that the 12-molybdophosphoric acid n-hydrate was not used, and the amount used of the 12-tungstophosphoric acid n-hydrate was changed to 4.17 g.

Production Example 9

Synthesis of Color Material O

The color material O in which molybdenum and tungsten are contained at a molar ratio of 0.3:99.7 was obtained in the same manner as Production Example 2, except that the amount used of the 12-molybdophosphoric acid n-hydrate was changed to 0.016 g, and the amount used of the 12-tungstophosphoric acid n-hydrate was changed to 4.57 g.

Production Example 10

Synthesis of Color Material P

The color material P in which molybdenum and tungsten are contained at a molar ratio of 0.08:99.92 was obtained in the same manner as Production Example 2, except that the amount used of the 12-molybdophosphoric acid n-hydrate was changed to 0.006 g, and the amount used of the 12-tungstophosphoric acid n-hydrate was changed to 4.17 g.

Comparative Production Example 1

Synthesis of Color Material H

The color material H in which molybdenum and tungsten are contained at a molar ratio of 17.8:82.3 was obtained in the same manner as Production Example 2, except that the amount used of the 12-molybdophosphoric acid n-hydrate was changed to 0.577 g, and the amount used of the 12-tungstophosphoric acid n-hydrate was changed to 3.34 g.

Comparative Production Example 2

Synthesis of Color Material I

The color material I in which tungsten is not contained was obtained in the same manner as Production Example 2, except that the 12-tungstophosphoric acid n-hydrate was not used, and the amount used of the 12-molybdophosphoric acid n-hydrate was changed to 2.89 g.

Comparative Production Example 3

Synthesis of Color Material J

First, 3.3 g (0.97 mmol) of the 12-tungstophosphoric acid n-hydrate (manufactured by Kanto Chemical Co., Inc.) was dissolved in 30 mL of water. To the resultant, 1.5 g (2.92 mmol) of Basic Blue 7 (BB7) (CI-42595) (manufactured by Tokyo Chemical Industry Co., Ltd.) dissolved in 30 mL of water, was added and agitated for one hour at ordinary temperature. The thus-obtained reaction solution was filtered at reduced pressure, thus obtaining a cake. The cake was washed with water and then dried at reduced pressure, thus obtaining 4.04 g (yield 96.5%) of the color material J.

Comparative Production Example 4

Synthesis of Color Material K

The color material K was obtained in the same manner as Comparative Production Example 3, except that 0.57 g (2.92 mmol) of sodium p-toluenesulfonate (manufactured by Tokyo Chemical Industry Co., Ltd.) was used in place of the 12-tungstophosphoric acid n-hydrate of 3.3 g.

Comparative Production Example 5

Synthesis of Color Material L

The color material L represented by the following chemical formula (3) was obtained in the same manner as Comparative Production Example 3, except that 0.54 g (1.46 mmol) of disodium naphthalene 2,6-sulfonate ((manufactured by Tokyo Chemical Industry Co., Ltd.) was used in place of the 12-tungstophosphoric acid n-hydrate of 3.3 g:

Chemical Formula (3)

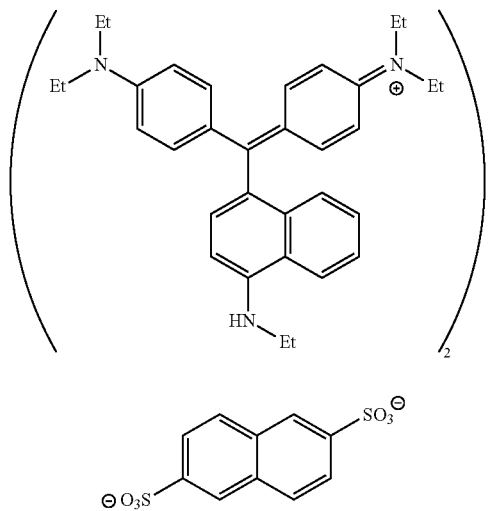

Comparative Production Example 6

Synthesis of Color Material M

The color material M represented by the following chemical formula (4) was obtained in the same manner as Comparative Production Example 3, except that 1.14 g (1.46 mmol) of Direct Blue 86 (manufactured by Tokyo Chemical Industry Co., Ltd.) was used in place of the 12-tungstophosphoric acid n-hydrate of 3.3 g:

Chemical Formula (4)

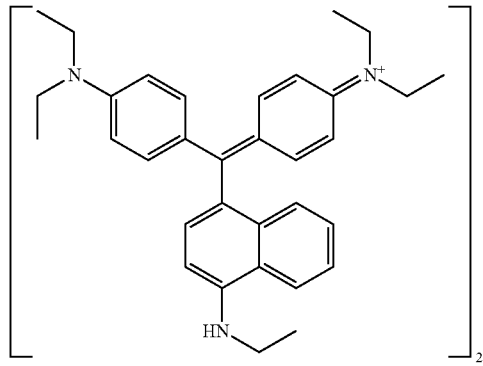

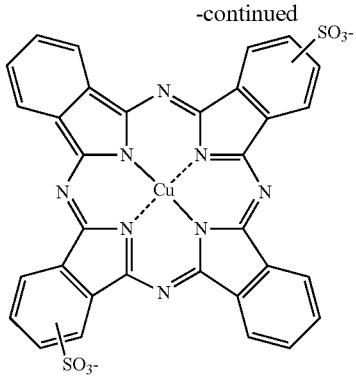

Comparative Production Example 7

Synthesis of Color Material N

In accordance with the method disclosed in Patent Literature 5, 12-molybdophosphate of polysiloxane dye was synthesized to obtain the color material N.

First, 51.52 g of Basic Blue 7 (BB7) (manufactured by Tokyo Chemical Industry Co., Ltd.) was dissolved in 750 ml of ion-exchanged water. Then, an aqueous solution of 2N sodium hydroxide was added thereto, with agitation, until the deprotonated form of the dye was completely precipitated, no blue color remained in the solution and did not return for several hours. The thus-produced precipitate was filtered off, washed three times with ion-exchanged water, and then dried at 60° C. under reduced pressure (0.1 kPa). Therefore, 45.23 g (94.7%) of deprotonated BB7 was separated in the form of nearly black powder.

Separately, 50 ml of 3-iodopropyl-trimethoxysilane (manufactured by Sigma-Aldrich) and 2.0 ml (2.95 g; 10.2 mmol) of an anhydrous ethanol solution were mixed and then agitated at room temperature for 60 hours under an argon flow. Then, the solvent was distilled away under a reduced pressure to obtain 3-iodopropyl-triethoxysilane. The thus-obtained 3-iodopropyl-triethoxysilane was dissolved in 50 ml of anhydrous acetonitrile, and 2.389 g (5 mmol) of the above-mentioned deprotonated BB7 was added thereto. Then under an argon flow, the thus-obtained solution was refluxed under heating for 24 hours. After the solvent was distilled away from the solution, a semisolid residue thus obtained was washed several times with methyl-t-butyl ether, under an argon flow, to remove the excess of alkylating agent and the unreacted deprotonated dye, until the filtrate was nearly colorless. A solid residue was separated therefore, which is silanized BB7. Then, 1 g of the silanized BB7 was dissolved in 25 ml of anhydrous ethanol to obtain a silanized BB7 solution.

Then, 25 ml of the silanized BB7 solution was added to a mixed solvent of 150 ml of ethanol (96%), 50 ml of water and 30 g of a 25% ammonia aqueous solution and agitated vigorously at room temperature for 24 hours to form seed particles. Then, the mixture was subjected to centrifugation. A residue thus obtained was dispersed in ethanol (80%) and subjected to three cycles of washing and centrifugation. Thereafter, the solvent was removed therefrom to obtain a residue. The thus-obtained residue was dispersed in dimethyl sulfoxide (DMSO), added in 400 ml of deionized water and agitated. Furthermore, 12-molybdophosphoric acid n-hydrate was added thereto, thereby obtaining the color material N of Comparative Production Example V.

Example 1

(1) Production of Color Material Dispersion Liquid A

First, 1.0 part by mass of the color material A of Production Example 2, 3.0 parts by mass of the dispersant solution A of Production Example 1, 10.0 parts by mass of propylene glycol monomethyl ether acetate (PGMEA, manufactured by DAICEL Chemical Industries, Ltd.) and 20 parts by mass of zirconia beads with a diameter of 2 mm were put in a 30 ml mayonnaise jar and pre-pulverized for one hour by means of a paint shaker (manufactured by Asada Iron Works Co., Ltd.) Then, the solution was moved to another 30 ml mayonnaise jar, followed by addition of 2.0 parts by mass of zirconia beads having a diameter of 0.1 mm. Then, the jar was shaken for 12 hours by means of the paint shaker to obtain the color material dispersion liquid A.

(2) Production of Color Resin Composition for Color Filters

First, 6.1 parts by mass of the color material dispersion liquid A was mixed with the following: 1.98 parts by mass of a methacrylic acid/methyl methacrylate/benzyl methacrylate copolymer (molar ratio: 10/30/50, mass average molecular weight: 9,000, acid value: 70 mgKOH/g, active substance content: 40% by mass); 0.65 part by mass of a dipentaerythritol hexaacrylate monomer ("ARONIX M-403" manufactured by TOAGOSEI Co., Ltd.); 0.22 part by mass of IRGACURE 907 (manufactured by Ciba Specialty Chemicals, Inc.); 0.03 part by mass of KAYACURE DETX-S (manufactured by Nippon Kayaku Co., Ltd.); 0.03 part by mass of KBM503 (manufactured by Shin-Etsu Chemical Co., Ltd.); 0.0003 part by mass of MEGAFACE R08MH (manufactured by DIC Corporation); and 4.67 parts by mass of PGMEA. The mixture was agitated and filtered with a 0.25 µm mesh to obtain a color composition A for color filters.

Examples 2 to 9

Color material dispersion liquids B to G, O and P were produced in the same manner as described above under "(1) Production of color material dispersion liquid A" of Example 1, except that the color materials B to G, O and P of Production Examples 2 to 9 were each used in place of the color material A.

Then, color compositions B to G, O and P for color filters were obtained in the same manner as described above under "(2) Production of color resin composition for color filters" of Example 1, except that the color material dispersion liquids B to G, O and P were each used in place of the color material dispersion liquid A.

Comparative Example 1 to 7

Production of Comparative Color Material Dispersion Liquids H to N

Comparative color material dispersion liquids H to N were produced in the same manner as described above under "(1) Production of color material dispersion liquid A" of Example 1, except that the color materials H to N of Comparative Production Examples 1 to 7 were each used in place of the color material A.

Then, the comparative color compositions H to N for color filters were obtained in the same manner as "(2) Production of color resin composition for color filters" of Example 1, except that the comparative color material dispersion liquids H to N were each used in place of the color material dispersion liquid A.

[Measurement of the Molar Ratio Between Molybdenum and Tungsten in the Color Materials]

An elementary analysis of the above-obtained color materials A to J, N and O was carried out by use of an x-ray fluorescence (XRF) analyzer (RIX-3100 manufactured by Rigaku Corporation).

The XRF measurement condition is as follows:
Measured color material diameter: 30 mmp
Atmosphere: Under a vacuum of 13 Pa
Measured elements: Elements starting in the order of atomic number from boron (B) to uranium (U)

An actual measured ratio was obtained from the detection results of Mo and W, of the elements detected in the above condition. The results are shown in Tables 1 and 2.

[Evaluation of Heat Resistance]

The color compositions A to G of Examples 1 to 7 and the comparative color compositions H to N of Comparative Examples 1 to 7 were each spin-coated onto a grass substrate at 400 rpm for 5 seconds and dried on a hot plate at 80° C. for 3 minutes. The substrate was subjected to exposure by use of a ultrahigh pressure mercury lamp (UI-501C manufactured by Ushio Inc.) The chromaticity of the color layer after being subjected to the exposure (before being subjected to baking) was measured. Then, the glass plate having the color layer formed thereon was post-baked in a clean oven at 220° C. for 30 minutes. The chromaticity of the thus-obtained blue color filter substrate was measured to obtain the color difference (ΔEab) before and after being subjected to the heating. The chromaticity was measured with a spectral luminance meter (OSP200 manufactured by Olympus Corporation).

ΔEab value of less than 10 indicates excellent heat resistance.

[Evaluation of Light Resistance]

The color compositions A to G of Examples 1 to 7 and the comparative color compositions H to N of Comparative Examples 1 to 7 were each spin-coated onto a glass substrate at 400 rpm for 5 seconds and dried on a hot plate at 80° C. for 3 minutes. The substrate was subjected to overall exposure by use of a ultrahigh pressure mercury lamp (UI-501C manufactured by Ushio Inc.) The glass plate having the color layer formed thereon was post-baked in a clean oven at 200° C. for 30 minutes. Then, the chromaticity of the color layer was measured. Next, the glass plate having the color layer formed thereon was irradiated with a xenon lamp (Ci4000 weather meter manufactured by ATLAS; inner filter: quartz inner filter; outer filter: soda lime with IR-absorbing coating (CIRA); cutoff wavelengths: 300 nm or less) for 23 hours at a wavelength of 420 nm and an irradiance of 1.2 W/m² (corresponding to 100 kJ/m²). The chromaticity of the obtained blue color filter substrate was measured to obtain the color difference (ΔEab) before and after being subjected to the heating. The chromaticity was measured with a spectral luminance meter (OSP200 manufactured by Olympus Corporation).

ΔEab value of less than 15 indicates excellent light resistance. ΔEab value of less than 10 indicates particularly excellent light resistance.

The evaluation results of heat resistance and light resistance are shown in Table 1.

the color resin compositions of Examples 7 to 9, each of which containing the color materials G, O and P respectively

TABLE 1

| | Color material | Structure of color material | | Content Ratio | | Actual measured ratio | | Evaluation | |
| --- | --- | --- | --- | --- | --- | --- | --- | --- | --- |
| | | Cationic skeleton | Anionic skeleton | Mo | W | Mo | W | Heat resistance ΔEab | Light resistance ΔEab |
| Example 1 | A | BB7-Nb-dimer | 12-Molybdophosphoric acid/12-Tungstophosphoric acid | 15 | 85 | 14.6 | 85.4 | 9.8 | 6.2 |
| Example 2 | B | BB7-Nb-dimer | 12-Molybdophosphoric acid/12-Tungstophosphoric acid | 10 | 90 | 9.9 | 90 | 8.2 | 6 |
| Example 3 | C | BB7-Nb-dimer | 12-Molybdophosphoric acid/12-Tungstophosphoric acid | 5 | 95 | 4.7 | 95.3 | 6.4 | 3.8 |
| Example 4 | D | BB7-Nb-dimer | 12-Molybdophosphoric acid/12-Tungstophosphoric acid | 2 | 98 | 1.9 | 98.1 | 3.6 | 9.2 |
| Example 5 | E | BB7-Nb-dimer | 12-Molybdophosphoric acid/12-Tungstophosphoric acid | 1 | 99 | 1.1 | 98.9 | 2.8 | 9.5 |
| Example 6 | F | BB7-Nb-dimer | 12-Molybdophosphoric acid/12-Tungstophosphoric acid | 0.5 | 99.5 | 0.4 | 99.6 | 3.5 | 9.8 |
| Example 7 | G | BB7-Nb-dimer | 12-Molybdophosphoric acid/12-Tungstophosphoric acid | 0 | 100 | 0 | 100 | 6.2 | 14.2 |
| Comparative Example 1 | H | BB7-Nb-dimer | 12-Molybdophosphoric acid/12-Tungstophosphoric acid | 20 | 80 | 17.8 | 82.3 | 10.3 | 6 |
| Comparative Example 2 | I | BB7-Nb-dimer | 12-Molybdophosphoric acid/12-Tungstophosphoric acid | 100 | 0 | 100 | 0 | 15.2 | 3.2 |
| Comparative Example 3 | J | BB7 | 12-Molybdophosphoric acid/12-Tungstophosphoric acid | 0 | 100 | 0 | 100 | 6.5 | 39.2 |
| Comparative Example 4 | K | BB7 | $CH_3$—$C_6H_5$—$SO_3$— | — | — | — | — | 8.9 | 34.2 |
| Comparative Example 5 | L | BB7 | 2,6-Naph-$(SO_3-)_2$ | — | — | — | — | 4.5 | 35.1 |
| Comparative Example 6 | M | BB7 | CuPc-$(SO_3-)_2$ | — | — | — | — | 7.2 | 21.6 |
| Comparative Example 7 | N | —((BB7—Pr)—$Si(OMe)_2O$)— | 12-Molybdophosphoric acid | 100 | 0 | 100 | 0 | 24.5 | 7.5 |

[Results]

From the results of the actual measured ratio between molybdenum and tungsten, it is clear that the color materials A to F are each the above-described first color material, and the color material G is the above-described second color material.

From the results shown in Table 1, it is clear that the color resin compositions of Examples 1 to 7, each of which containing the color material represented by the general formula (I), are excellent in both heat resistance and light resistance.

Particularly, it is clear that the coating films formed from the color resin compositions of Examples 1 to 6, each of which containing the first color material in which the molar ratio between the molybdenum and the tungsten in the polyoxometalate anion is 0.4:99.6 to 15:85, are highly excellent in light resistance.

The color resin composition of Comparative Example 1, which contains the color material in which the molar ratio between the molybdenum and the tungsten in the polyoxometalate anion is 20:80, and the color resin composition of Comparative Example 2, which contains the color material in which tungsten is not contained in the polyoxometalate anion, are excellent in light resistance. However, they are inferior in heat resistance.

[Evaluation of Luminance after being Subjected to Post-Baking]

Next, the luminance of the following color resin compositions was evaluated after being subjected to post-baking: (each of the color materials served as the second color material); the color resin compositions of Example 6 and 2, each of which containing the color material F and B, respectively (each of the color materials served as the first color material); the color resin composition of Comparative Example 2, containing the color material I in which tungsten is not contained in the polyoxometalate anion; and the color resin composition of Comparative Example 3, containing the color material J (the color material served as a conventional triarylmethanebased lake pigment).

The color resin compositions were each spin-coated onto a glass substrate at 400 rpm for 5 seconds and dried on a hot plate at 80° C. for 3 minutes. The substrate was subjected to overall exposure by use of a ultrahigh pressure mercury lamp (UI-501C manufactured by Ushio Inc.) The chromaticity of the color layer after being subjected to the exposure (before being subjected to baking) was measured. Then, the luminance value (Y) at a chromaticity coordinate y=0.112 after being subjected to the exposure, was obtained. Next, the glass plate having the color layer formed thereon was post-baked in a clean oven at 220° C. for 30 minutes. The chromaticity of the thus-obtained blue color filter substrate was measured to obtain the luminance value (Y) at a chromaticity coordinate y=0.112 after being subjected to the heating. The chromaticity was measured with a spectral luminance meter (OSP200 manufactured by Olympus Corporation). When the luminance value after being subjected to the post-baking is 10.0 or more, it is evaluated that the luminance of the color layer after being subjected to heating at high temperature, is prevented from decreasing. When the luminance value after being subjected to the post-baking is 15.0 or more, it is evaluated that the effect of preventing from decreasing the luminance of the color layer after being subjected to heating at high temperature, is particularly excellent. The results are shown in Table 2.

<Criterion for Evaluation of the Luminance Value (Y)>

⊚: The luminance value (Y) is 15.0 or more
○: The luminance value (Y) is 10.0 or more and less than 15.0
x: The luminance value (Y) is less than 10.0

REFERENCE SIGNS LIST

1. Transparent substrate
2. Light shielding part
3. Color layer
10. Color filter
20. Counter substrate
30. Liquid crystal layer
40. Liquid crystal display device
50. Organic protection layer
60. Inorganic oxide layer

TABLE 2

| Color material | Structure of color material | | Actual measured ratio | | Evaluation of luminance value | |
|---|---|---|---|---|---|---|
| | Cationic skeleton | Anionic skeleton | Mo | W | After being subjected to exposure | After being subjected to heating |
| Example 7 G | BB7-Nb-dimer | 12-Molybdophosphoric acid/ 12-Tungstophosphoric acid | 0 | 100 | ⊚ | ⊚ |
| Example 9 P | BB7-Nb-dimer | 12-Molybdophosphoric acid/ 12-Tungstophosphoric acid | 0.08 | 99.92 | ⊚ | ⊚ |
| Example 8 O | BB7-Nb-dimer | 12-Molybdophosphoric acid/ 12-Tungstophosphoric acid | 0.3 | 99.7 | ⊚ | ⊚ |
| Example 6 F | BB7-Nb-dimer | 12-Molybdophosphoric acid/ 12-Tungstophosphoric acid | 0.4 | 99.6 | ⊚ | ○ |
| Example 2 B | BB7-Nb-dimer | 12-Molybdophosphoric acid/ 12-Tungstophosphoric acid | 9.9 | 90 | ⊚ | ○ |
| Comparative Example 2 I | BB7-Nb-dimer | 12-Molybdophosphoric acid/ 12-Tungstophosphoric acid | 100 | 0 | ○ | X |
| Comparative Example 3 J | BB7 | 12-Molybdophosphoric acid/ 12-Tungstophosphoric acid | 0 | 100 | ⊚ | X |

[Results]

From the results shown in Table 2, it is clear that the luminance values of the color resin compositions of Examples 2 and 6 to 9 after being subjected to the post-baking, the compositions containing the color material represented by the general formula (I), are all high and the luminance of the color layers after being subjected to heating at high temperature was prevented from decreasing, so that the color resin compositions are able to form a color layer with high luminance. Especially, the color layers of Examples 7 to 9, each of which containing the second color material in which the molar ratio of molybdenum to tungsten in the polyoxometalate anion is 0.05/99.95 or more and less than 0.4/99.6, were particularly high in luminance.

The color resin composition of Comparative Example 2, containing the color material in which tungsten is not contained in the polyoxometalate anion, showed a decrease in luminance value after being subjected to the exposure; moreover, the composition also showed a decrease in luminance due to the heating.

The reason is assumed that in the case where only phosphomolybdic acid is contained as the polyoxometalate anion, the acidity and the polyoxometalate particle diameter are smaller than the case of containing tungsten. The luminance of the coating film formed from the color resin composition of Comparative Example 3, the composition containing a conventional lake pigment, was remarkably decreased by the heating.

71. Transparent positive electrode
72. Positive hole injection layer
73. Positive hole transport layer
74. Light-emitting layer
75. Electron injection layer
76. Negative electrode
80. Organic light-emitting material
100. Organic light-emitting display device
201. Divalent or higher counter cation
202. Divalent or higher counter anion
203. Linkage by A
204. Ionic bond
205. Cation
206. Conventional dye salt-forming compound
210. Molecular association of the color material of the present invention

The invention claimed is:

1. A color material dispersion liquid comprising a color material represented by the following general formula (I), a dispersant, and a solvent having a solubility of the color material of 0.1 (mg/10 g solvent) or less at 23° C., wherein the dispersant is a polymer dispersant in which a nitrogen atom is contained in a main or side chain thereof, and wherein molybdenum and tungsten are contained in a polyoxometalate anion in the color material, and a molar ratio between the molybdenum and the tungsten is 0.05/99.95 or more and less than 0.4/99.6:

General Formula (I)

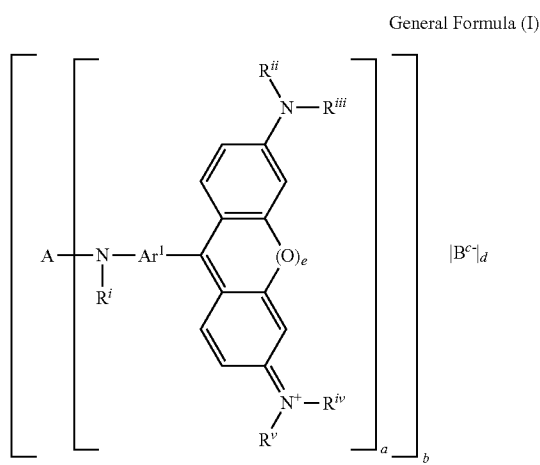

wherein A is an "a"-valent organic group in which a carbon atom directly bound to N has no π bond, and the organic group is a n aliphatic hydrocarbon group having a saturated aliphatic hydrocarbon group at least at a terminal position directly bound to N, or an aromatic group having the aliphatic hydrocarbon group having a saturated aliphatic hydrocarbon group at least at a terminal position directly bound to N, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; $R^i$s can be the same or different; $R^{ii}$s can be the same or different; $R^{iii}$s can be the same or different; $R^{iv}$s can be the same or different; $R^v$s can be the same or different; and $Ar^1$s can be the same or different; and wherein each of "a" and "c" is an integer of 2 or more; each of "b" and "d" is an integer of 1 or more; "e" is 0 or 1 and there is no bond when "e" is 0; and "e"s can be the same or different.

2. The color material dispersion liquid according to claim 1, wherein the solvent is an ester solvent.

3. A color resin composition for color filters, comprising the color material dispersion liquid defined by claim 1 and a binder component.

4. A color filter comprising at least a transparent substrate and color layers disposed on the substrate, wherein at least one of the color layers is a color layer which is a cured product of the color resin composition defined by claim 3.

5. A liquid crystal display device comprising the color filter defined by claim 4, a counter substrate, and a liquid crystal layer present between the color filter and the counter substrate.

6. An organic light-emitting display device comprising the color filter defined by claim 4 and an organic light-emitting material.

* * * * *